(12) United States Patent
Uchida et al.

(10) Patent No.: US 10,014,856 B2
(45) Date of Patent: Jul. 3, 2018

(54) SIGNAL TRANSMISSION DEVICE

(71) Applicant: MITSUBISHI ELECTRIC CORPORATION, Chiyoda-ku (JP)

(72) Inventors: Tetsuya Uchida, Chiyoda-ku (JP); Kenichi Morokuma, Chiyoda-ku (JP)

(73) Assignee: MITSUBISHI ELECTRIC CORPORATION, Chiyoda-ku (JP)

( * ) Notice: Subject to any disclaimer, the term of this patent is extended or adjusted under 35 U.S.C. 154(b) by 0 days.

(21) Appl. No.: 15/543,080

(22) PCT Filed: Jan. 12, 2016

(86) PCT No.: PCT/JP2016/050677
§ 371 (c)(1),
(2) Date: Jul. 12, 2017

(87) PCT Pub. No.: WO2016/117410
PCT Pub. Date: Jul. 28, 2016

(65) Prior Publication Data
US 2018/0013424 A1 Jan. 11, 2018

(30) Foreign Application Priority Data
Jan. 20, 2015 (JP) .................. 2015-008807

(51) Int. Cl.
*H02J 1/00* (2006.01)
*H02J 3/00* (2006.01)
(Continued)

(52) U.S. Cl.
CPC ....... *H03K 17/691* (2013.01); *H01L 23/5386* (2013.01); *H01L 27/0255* (2013.01);
(Continued)

(58) Field of Classification Search
CPC .... H03K 17/691; H03K 17/693; H03K 3/356; H03K 3/3565; H03K 3/012; H02J 5/00;
(Continued)

(56) References Cited

U.S. PATENT DOCUMENTS

2009/0147544 A1* 6/2009 Melanson ............... H02M 1/08
363/21.01
2009/0207538 A1* 8/2009 Crawley .................. H04L 12/10
361/56
(Continued)

FOREIGN PATENT DOCUMENTS

JP 8-51457 A 2/1996
JP 2010-206754 A 9/2010
(Continued)

OTHER PUBLICATIONS

International Search Report dated Mar. 22, 2016, in PCT/JP2016/050677, filed Jan. 12, 2016.

*Primary Examiner* — Rexford Barnie
*Assistant Examiner* — Jagdeep Dhillon
(74) *Attorney, Agent, or Firm* — Oblon, McClelland, Maier & Neustadt, L.L.P.

(57) ABSTRACT

This invention, is concerning a signal voltage device, in which transformers 22a, 22b and a reception circuit 24 are formed on the same chip, and accordingly, no ESD protective element connected to a transformer connection terminal of the reception circuit 24 is required, and negative pulses generated in reception-side inductors 11 can be used in signal transmission. Signal transmission using both positive pulses and negative pulses is made possible as a result, and a stable signal transmission operation can be carried out even in a case where delay time varies in a signal detection circuit. Further, a reception circuit of low power consump-
(Continued)

tion can be configured by using a single-ended Schmitt trigger circuit 14 in the signal detection circuit.

5 Claims, 25 Drawing Sheets

(51) Int. Cl.
| | |
|---|---|
| *H03K 17/691* | (2006.01) |
| *H03K 3/3565* | (2006.01) |
| *H03K 5/24* | (2006.01) |
| *H03K 3/012* | (2006.01) |
| *H01L 27/02* | (2006.01) |
| *H01L 23/538* | (2006.01) |
| *H03K 3/356* | (2006.01) |

(52) U.S. Cl.
CPC ............ *H03K 3/012* (2013.01); *H03K 3/3565* (2013.01); *H03K 3/356104* (2013.01); *H03K 5/2481* (2013.01)

(58) Field of Classification Search
CPC .... H02J 5/005; H02J 7/02; H02J 7/025; H02J 7/007; H04B 5/0037; H04B 5/00; H04B 5/005
USPC ...... 307/104, 83, 66, 64, 69, 82; 361/56, 52, 361/77
See application file for complete search history.

(56) References Cited

U.S. PATENT DOCUMENTS

| | | | |
|---|---|---|---|
| 2011/0057291 A1* | 3/2011 | Slupsky | G08C 17/04 257/531 |
| 2011/0267725 A1* | 11/2011 | Scuderi | H01L 23/645 361/56 |
| 2012/0212251 A1 | 8/2012 | Yanagishima et al. | |
| 2013/0287141 A1 | 10/2013 | Kaeriyama | |
| 2014/0049297 A1* | 2/2014 | Nagai | H02M 1/08 327/109 |
| 2014/0097697 A1* | 4/2014 | Cho | G06F 1/26 307/104 |
| 2014/0327494 A1* | 11/2014 | Sato | H03H 11/348 333/103 |
| 2015/0103950 A1 | 4/2015 | Kaeriyama | |
| 2015/0137843 A1 | 5/2015 | Yanagishima et al. | |
| 2015/0249483 A1* | 9/2015 | Ichikawa | H02J 5/005 320/108 |
| 2015/0326033 A1* | 11/2015 | Ichikawa | H02J 5/005 307/104 |
| 2016/0006542 A1 | 1/2016 | Kaeriyama | |
| 2016/0190803 A1* | 6/2016 | Uno | H02M 3/1584 307/82 |

FOREIGN PATENT DOCUMENTS

| | | |
|---|---|---|
| JP | 2011-146934 A1 | 7/2011 |
| JP | 2013-229815 A | 11/2013 |
| WO | 2010/095368 A1 | 8/2010 |
| WO | 2011/055811 A1 | 5/2011 |

* cited by examiner

FIG. 10A
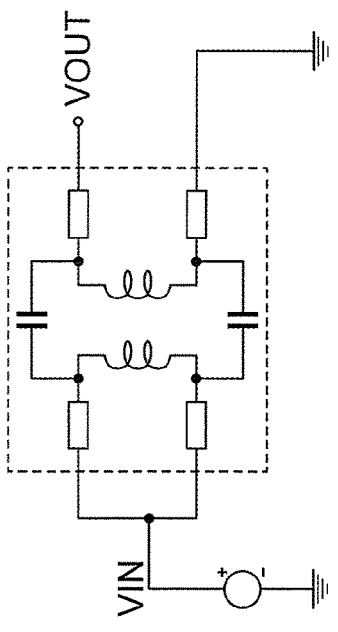
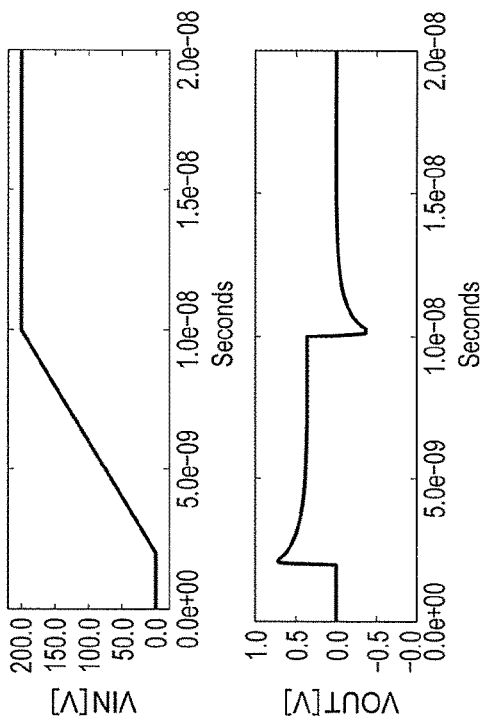
FIG. 10B
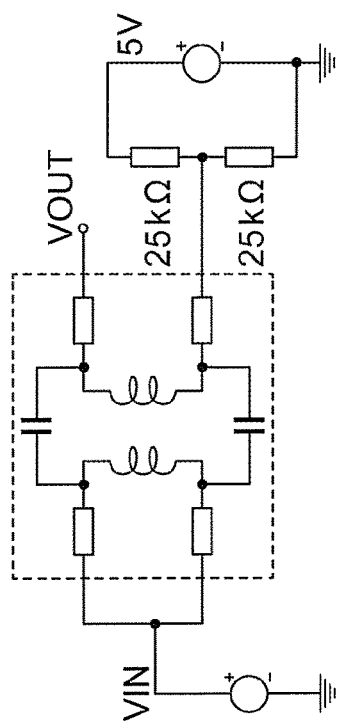
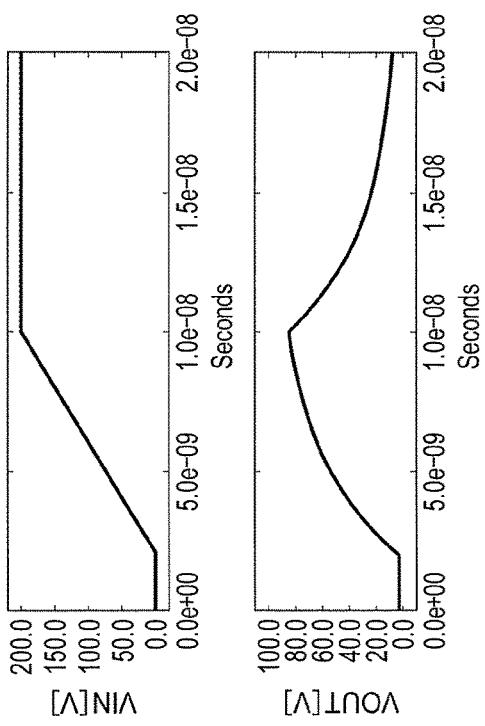

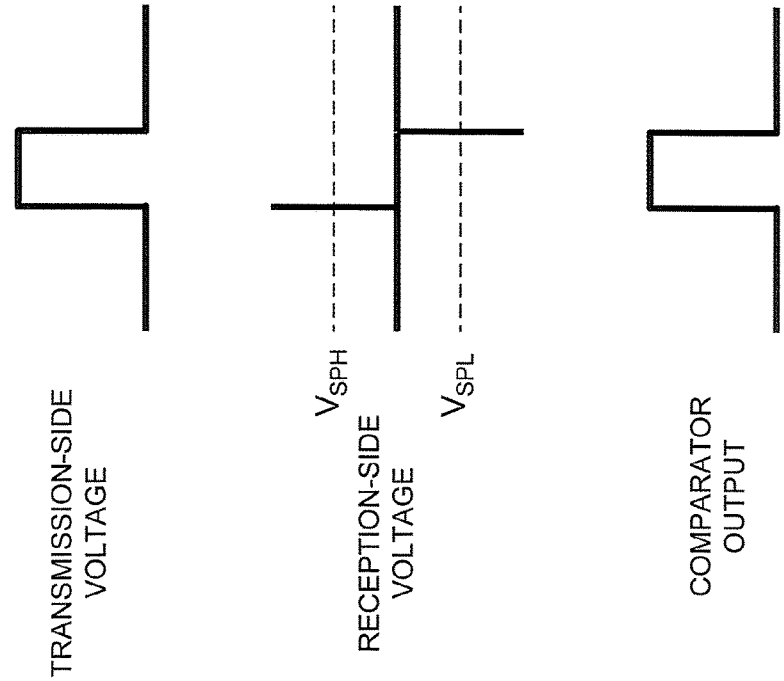
FIG. 14A
FIG. 14B
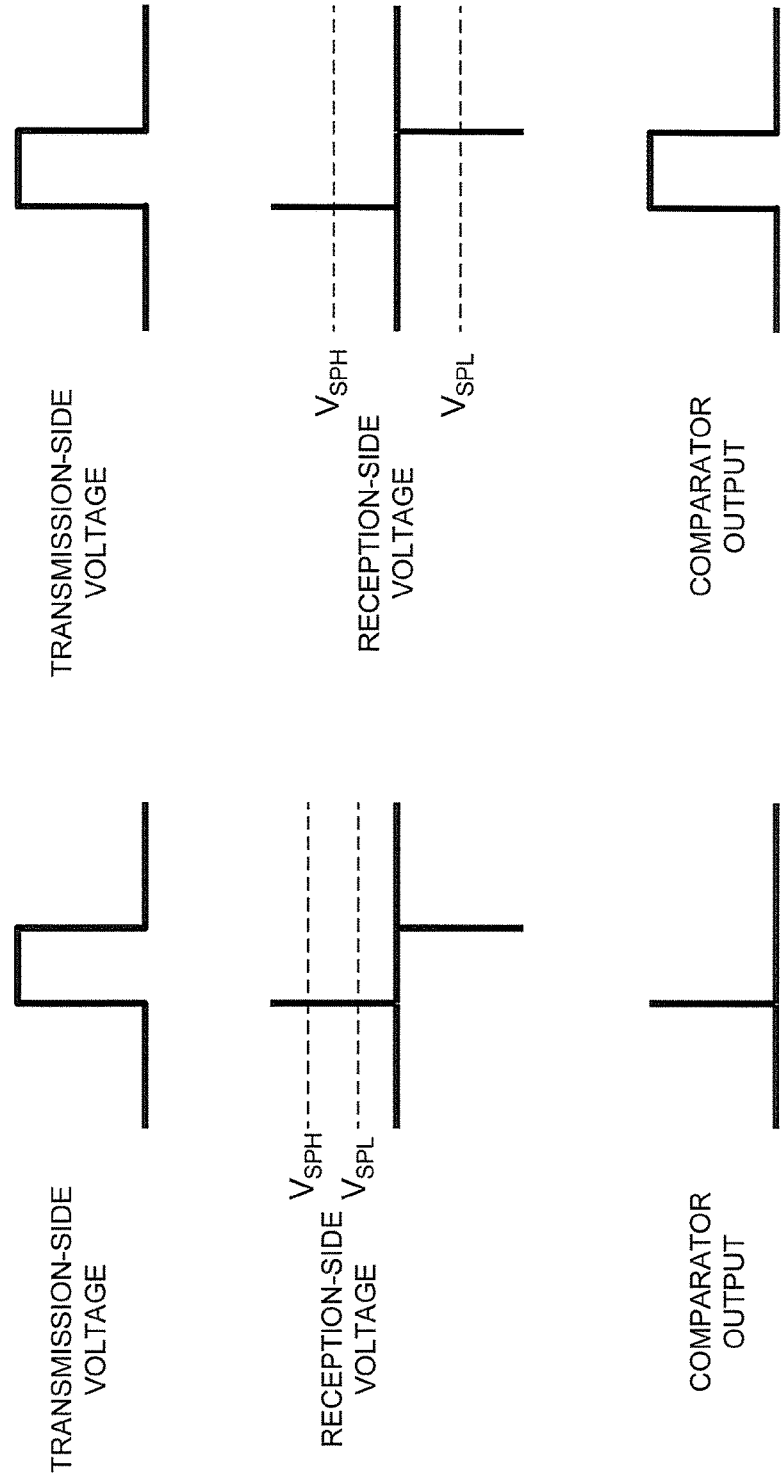

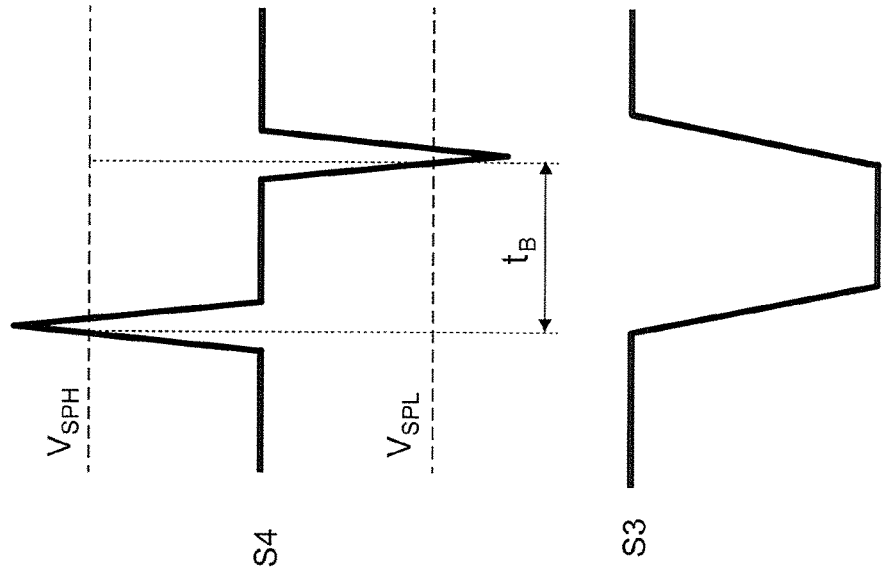
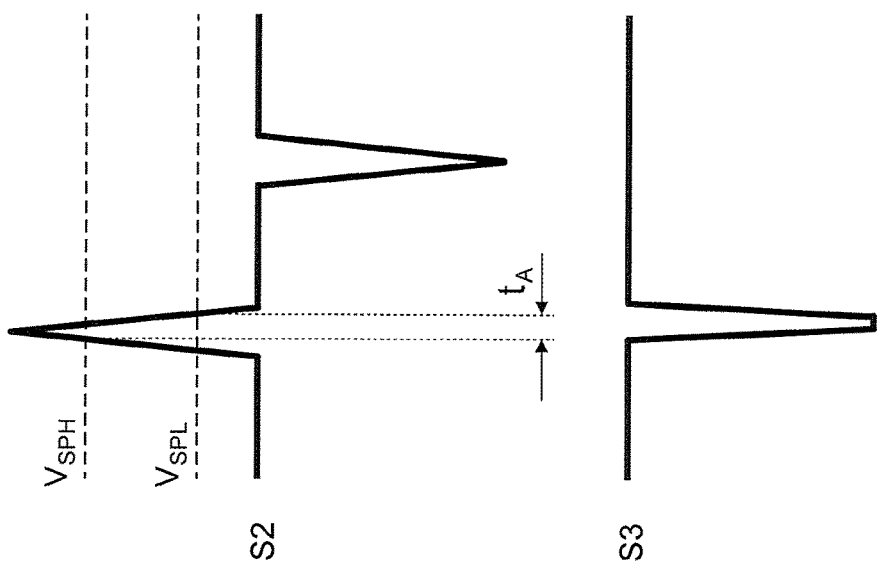

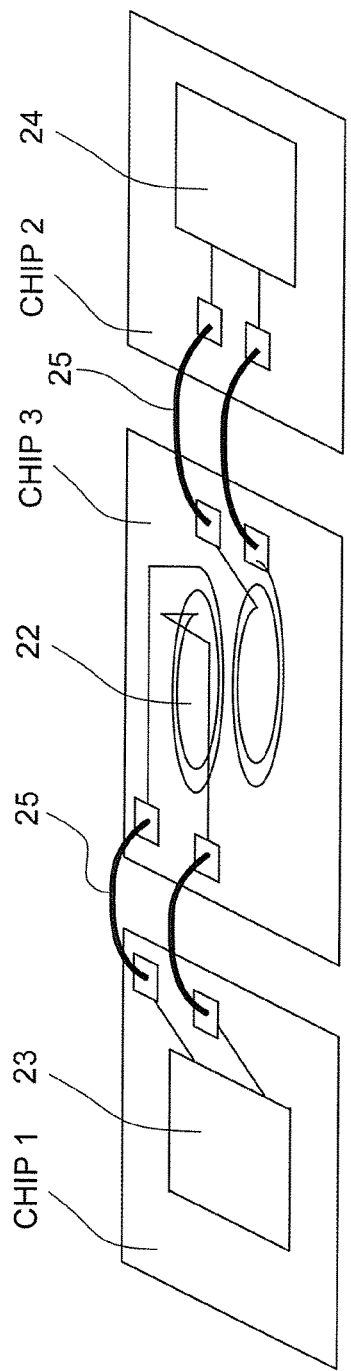
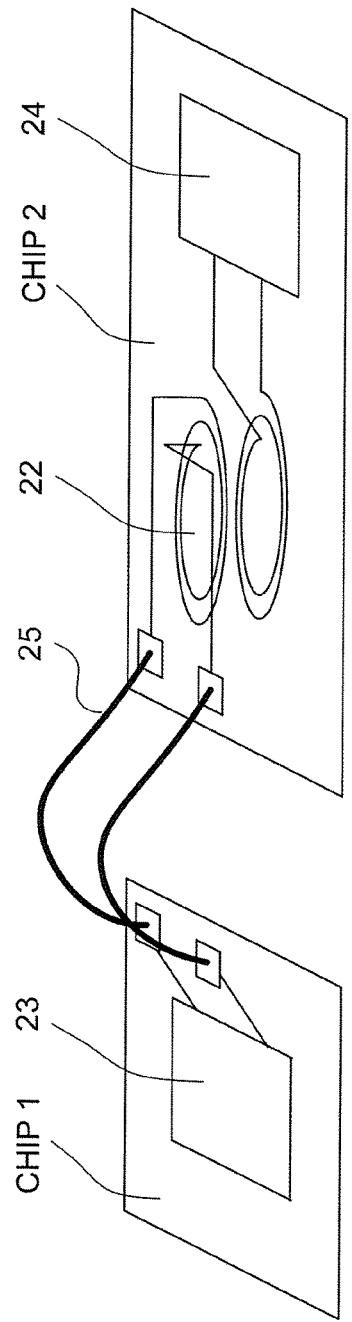
FIG. 16A
FIG. 16B

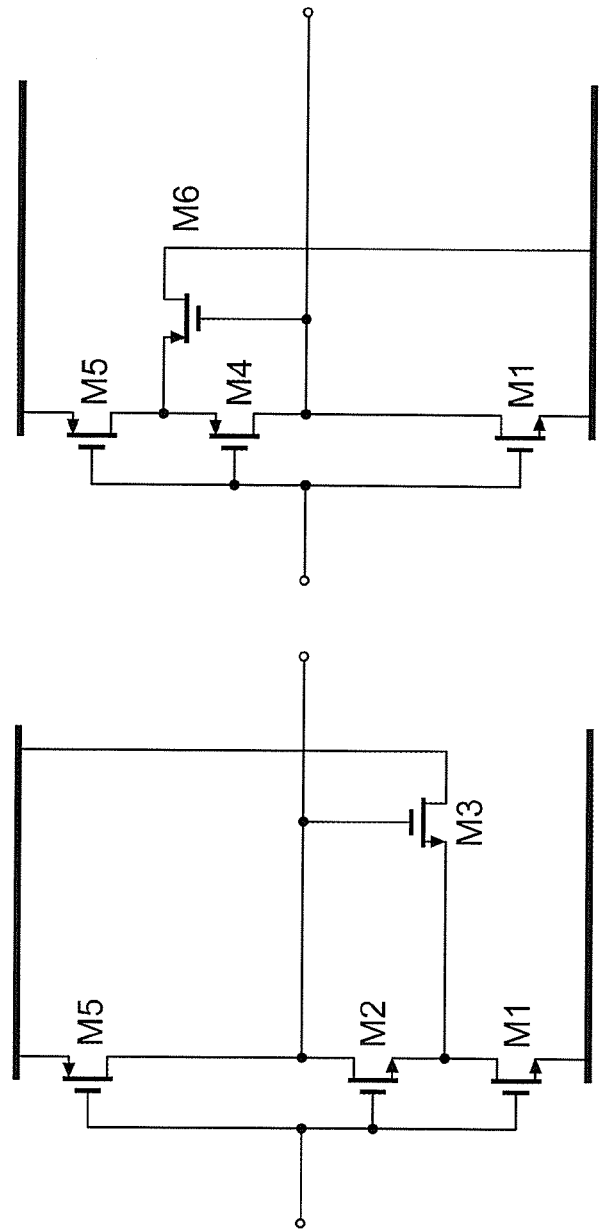

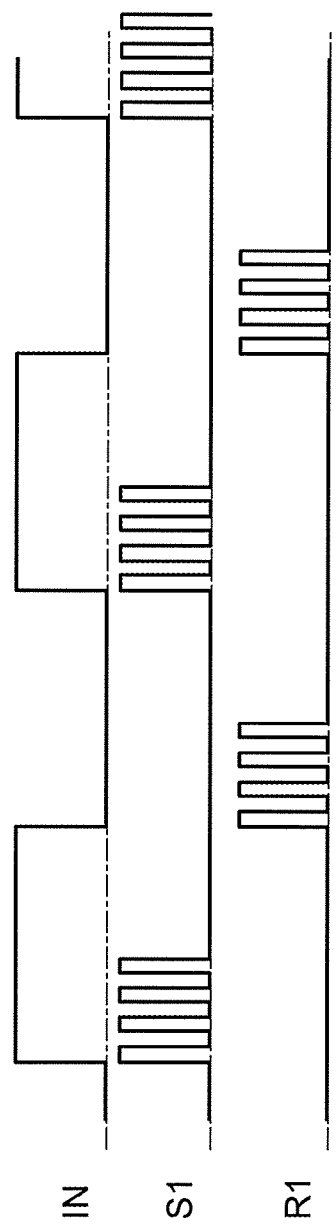

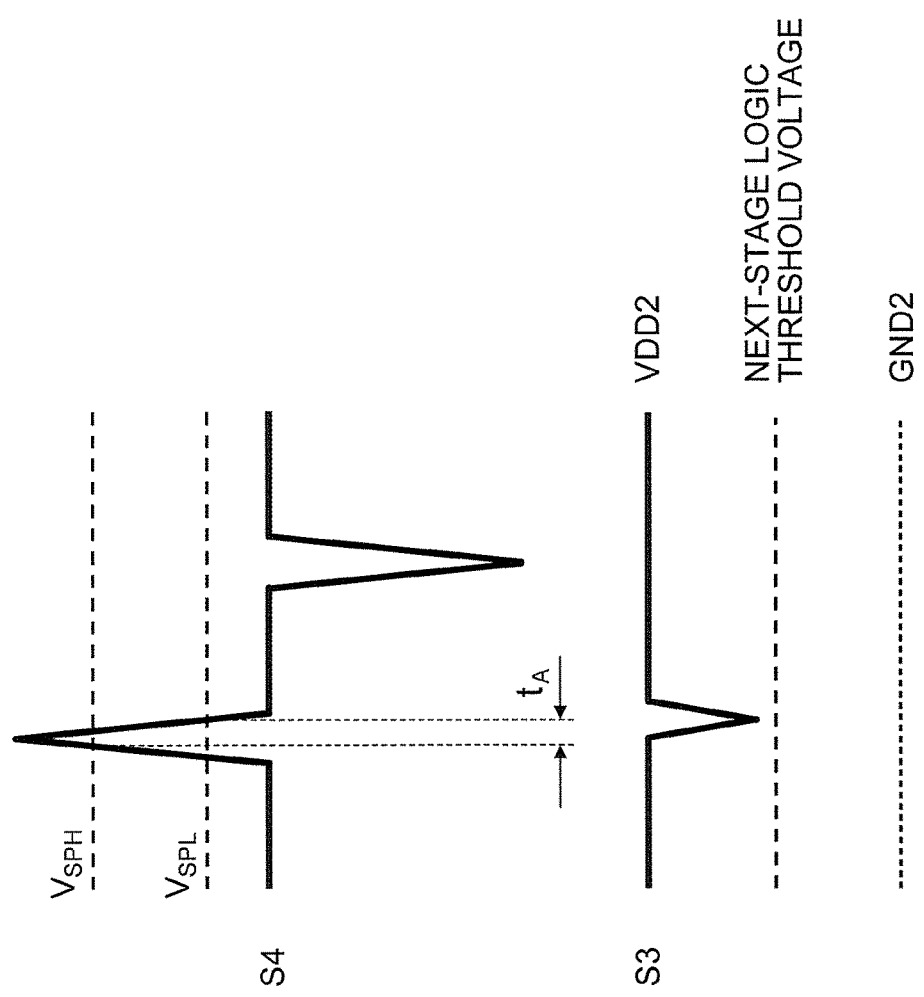

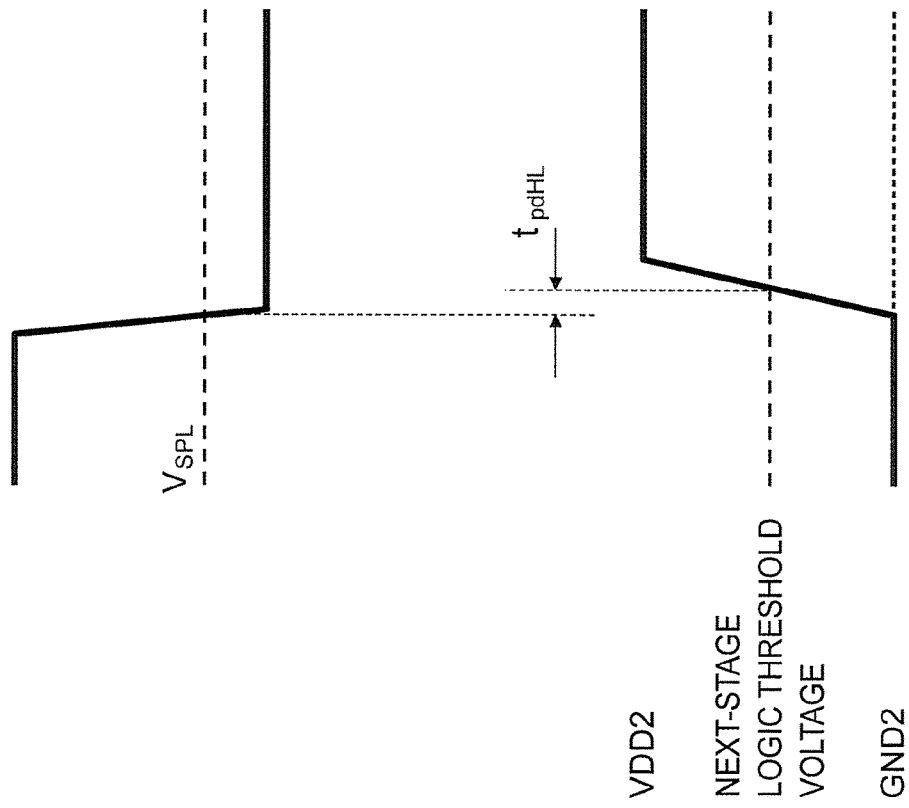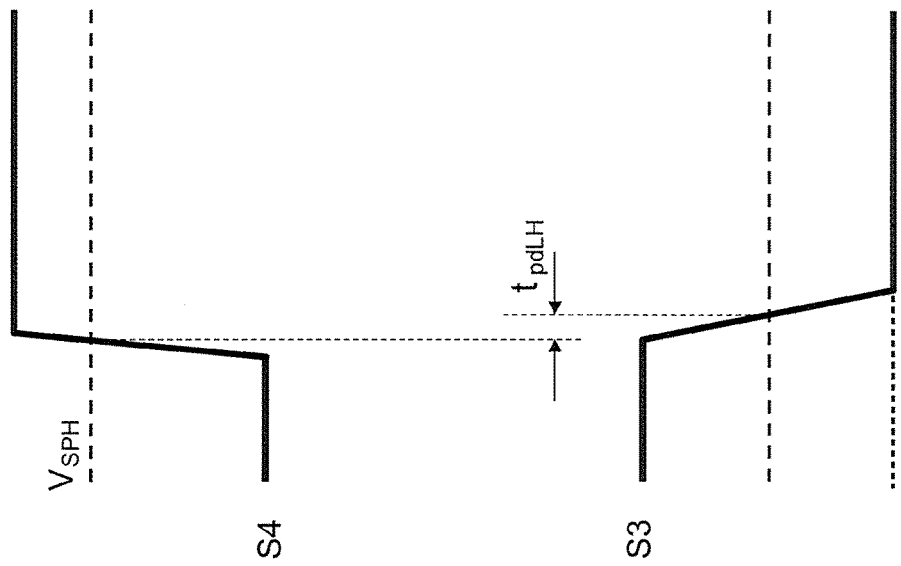

SIGNAL TRANSMISSION DEVICE

TECHNICAL FIELD

The present invention relates to a signal transmission device, and more particularly to a signal transmission device that, in a power conversion circuit (for instance, an inverter), electrically insulates a low voltage region, in which a control circuit (for instance, a microcomputer) is disposed, and a high voltage region, in which a semiconductor switch (for instance, an IGBT (Insulated Gate Bipolar Transistor)) is disposed, from each other, and that transmits to the semiconductor switch from, a control circuit a gate driving signal for opening and closing the semiconductor switch.

BACKGROUND ART

Signal transmission devices having a function of insulating input from output in power conversion circuits arid a function of transmitting signals have come to be used conventionally in power conversion circuits.

Signal transmission devices used in power conversion circuits for such a purpose include signal transmission devices, for instance as disclosed in PTL 1, that utilize a micro-transformer created on an integrated circuit. In the signal transmission circuit; device disclosed in PTL 1, a reception-side inductor is DC biased to ground voltage or to power-supply voltage. Among the positive and negative pulse voltages that are induced in the reception-side inductor only positive pulses are used in signal transmission.

CITATION LIST

Patent Literature

[PTL 1] WO 2011/055611 A1
[PTL 2] JP 2011-146934 A
[PTL 3] WO 2010/095368 A1

SUMMARY OF INVENTION

Technical Problem

In the conventional signal transmission circuit device disclosed in PTL 1, signal transmission is carried out using only positive pulses from among positive and negative pulse voltages that are induced in the reception-side inductor. As a result, a problem arose in that the signal transmission circuit was prone to malfunctioning in the case of delay time variability in a signal detection circuit at a transformer reception end. The conventional signal transmission circuit device disclosed in PTL 1 was problematic in that power consumption in the signal detection circuit was large when the reception-side inductor was biased to around.

It is an object of the present invention, arrived at with a view to solving the above problems, to obtain a signal transmission device that enables stable signal transmission operation also in the case of delay time variability in a signal detection circuit, while curtailing power consumption.

Solution to Problem

A signal transmission device is provided with: a transmission circuit that operates with power from a first power supply and generates from an input signal a transmission signal; a transformer that is connected to the transmission circuit; and a reception circuit that operates with power from a second power supply and receives, via the transformer, the transmission signal outputted by the transmission circuit; wherein the transformer has a total of two transformers, which are a first transformer and a second transformer, each of the transformers being made up of a transmission-side inductor and a reception-side, inductor; the transmission circuit inputs a transmission-side voltage signal, made up of one or a plurality of pulses, to a transmission terminal of the transmission-side inductor of the first transformer, in synchronization with a rising edge of the input signal; and inputs a transmission-side voltage signal, made up of one or a plurality of pulses, to a transmission terminal of the transmission-side inductor of the second transformer, in synchronization with a falling edge of the input signal; one terminal of two terminals of each of the reception-side inductors of the first and second transformers is connected to the second power supply or ground of the reception circuit, while the other terminal of the two terminals is connected to an input terminal of a signal detection circuit provided in the reception circuit, via a capacitor and the signal detection circuit is configured of a single-ended Schmitt trigger circuit.

Advantageous Effects of Invention

In the present embodiment, two transformers and a reception circuit are formed on the same chip. As a result, no HSD protective element connected to the transformer connection terminal of the reception circuit is required, and accordingly negative pulses generated in the reception-side inductors that make up the transformers can be used in signal transmission. Signal transmission using both positive pulses and negative pulses is made possible as a result, and a stable signal transmission operation can be carried out even in a case where delay time varies in the signal detection circuit. Further, a reception circuit of low power consumption can be configured by using a single-ended Schmitt trigger circuit in the signal detection circuit.

BRIEF DESCRIPTION OF DRAWINGS

FIG. 10A is a diagram illustrating a simulation result of signal voltage generated by dV/dt noise in a case where a reception-side inductor is biased to 2.5 V.

FIG. 10B is a diagram: illustrating a simulation result of signal voltage generated by dV/dt noise in a case where a reception-side inductor is DC-biased to ground level.

FIG. 12B is a diagram illustrating the operation of the single-ended input Schmitt trigger circuit depicted in. FIG. 12A.

FIG. 14A is an explanatory diagram illustrating a setting method of switching point, voltage in a conventional signal transmission circuit.

FIG. 14B is an explanatory diagram illustrating a setting method of switching point voltage in the signal transmission device according to Embodiment 1 of the present invention.

FIG. 15A is an explanatory diagram illustrating a request for delay time in a conventional signal transmission circuit.

FIG. 15B is an explanatory diagram illustrating a request for delay time in the signal transmission device according to Embodiment 1 of the present invention.

FIG. 16A is a perspective-view diagram illustrating a chip configuration in a signal transmission device according to Embodiment 5 of the present invention.

FIG. 16B is a perspective-view diagram illustrating a chip configuration in the signal, transmission device according to Embodiment 1 of the present invention.

FIG. 21A is a circuit diagram illustrating another example of a single-ended input Schmitt trigger circuit in a signal transmission device according to Embodiment 3 of the present invention.

FIG. 21B is a circuit diagram illustrating another example of a single-ended input Schmitt trigger circuit in the signal transmission device according to Embodiment 3 of the present invention.

FIG. 22 is an explanatory diagram illustrating signal waveforms of a case where there is used a plurality of pulses by a signal transmission device according to Embodiment 4 of the present invention.

FIG. 23 is a diagram illustrating an operation in case of increased delay time in a Schmitt trigger circuit.

FIG. 24A is a diagram illustrating a definition of delay time in a Schmitt trigger circuit.

FIG. 24B is a diagram illustrating a definition of delay time in a Schmitt trigger circuit.

DESCRIPTION OF EMBODIMENTS

Embodiment 1

Figure 1:
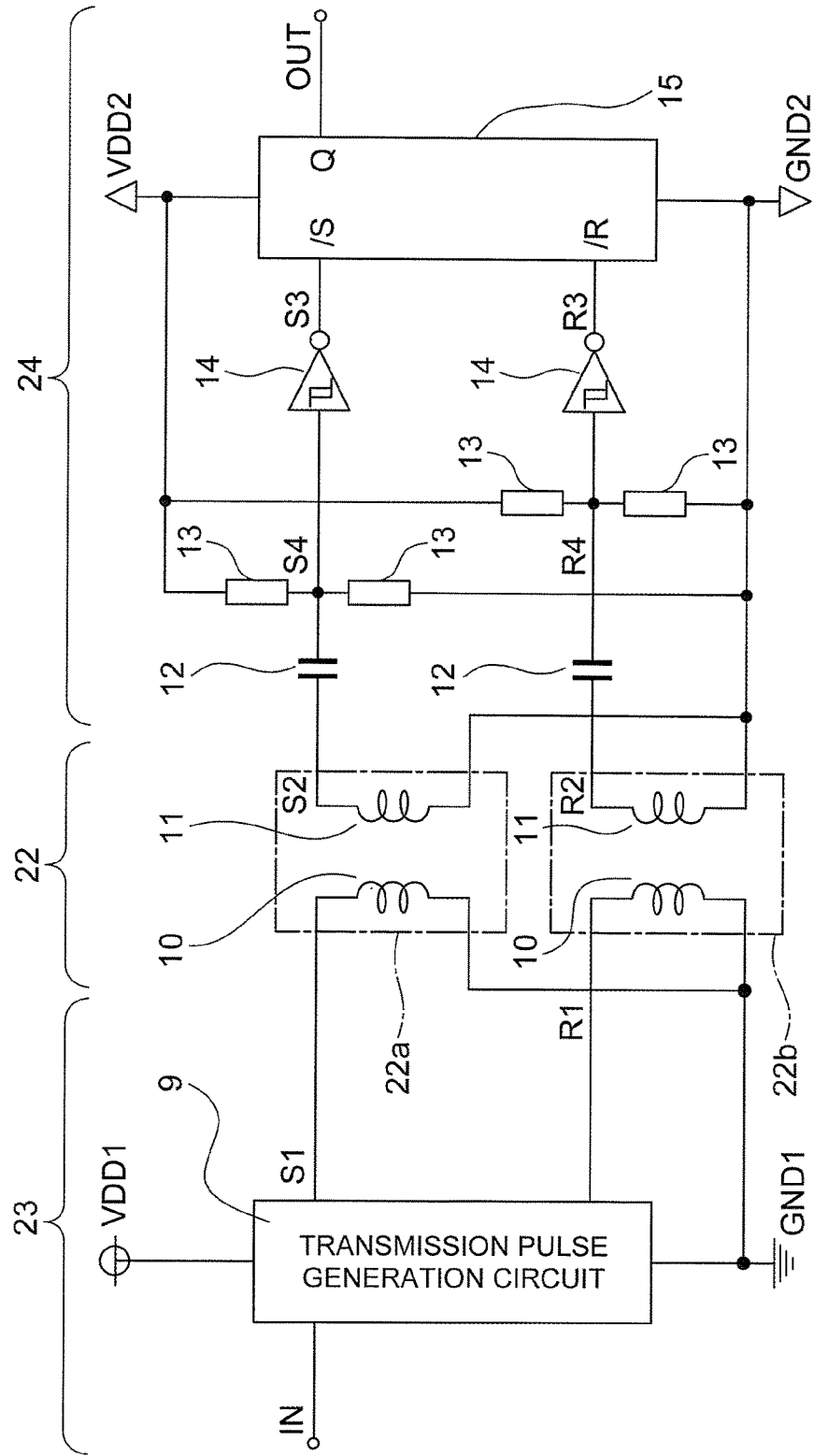
FIG. 1 is a circuit diagram illustrating the configuration of a signal transmission device -according to Embodiment 1 of the present invention.
Figure 2:
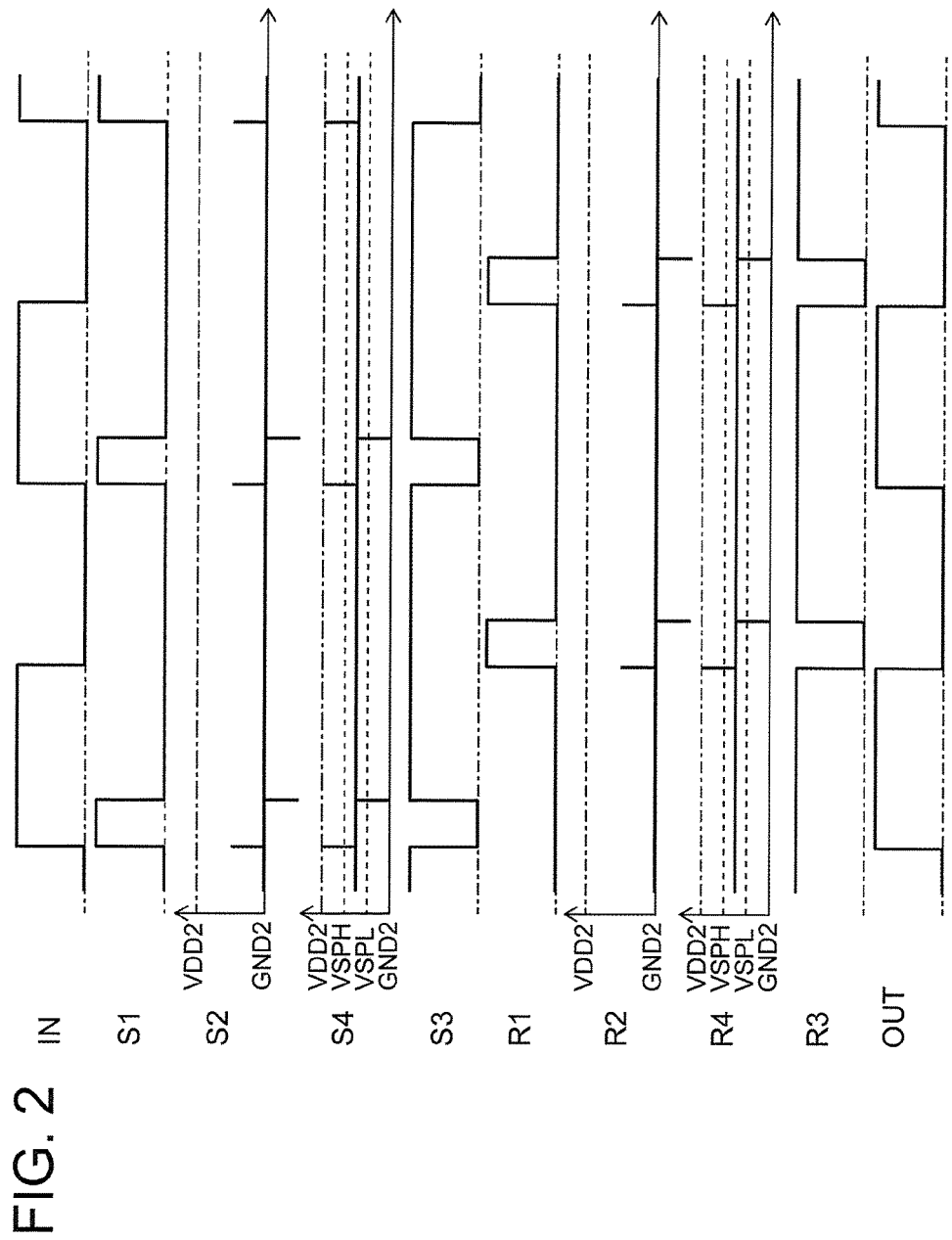
FIG. 2 is an explanatory diagram, illustrating signal waveforms of the signal transmission device according to Embodiment 1 of the present invention.

FIG. 1 illustrates the configuration of a signal transmission device according to Embodiment 1 of the present invention. FIG. 2 illustrates signal wave forms at the various terminals provided in the signal transmission device of FIG. 1. The reference symbols of the terminals of FIG. 1 and the reference symbols of the terminals of FIG. 2 match each other. In broad terms, the signal transmission device according to the present Embodiment 1 is made up of a transformer 22, a transmission circuit 23 and a reception circuit 24, as illustrated in FIG. 1.

In a more detailed explanation, the signal transmission device according to the present Embodiment 1 has disposed therein a transmission pulse generation circuit 9, two transformers 22 (22a and 22b), two coupling capacitors 12, two pairs of bias resistors 13, two single-ended Schmitt trigger circuits 14 and one RS flip flop 15, as illustrated in FIG. 1. Each transformer 22a and 22b is made up of one pair of inductors, namely a transmission-side inductor 10 and a reception-side inductor 11. In FIG. 1, the transformer 22a is a transformer (first transformer) for set signals, and the transformer 22b is a transformer 22b (second transformer) for reset signals. In the configuration of FIG. 1, the transmission pulse generation circuit 9 makes up the transmission circuit 23. The coupling capacitors 12, the bias resistors 12, the single-ended Schmitt trigger circuits 14 and the RS flip flop 15 make up the reception circuit 24. The single-ended Schmitt trigger circuits 14 make up a signal detection circuit.

One of the two terminals of each transmission-side inductor 10 of the transformers 22a, 22b is connected to ground GMD1 of the transmission circuit 23, and the other terminal is connected to a respective output terminal S1 or R1 of the transmission pulse generation circuit 9. One of the two terminals of each reception-side inductor 11 of the transformers 22a, 22b is connected to around level GND2 of the reception circuit 24, and is DC biased to ground level. The other terminals of the reception-side inductors 11 are respectively connected to input terminals S4 and R4 of the single-ended Schmitt trigger circuits 14, via the coupling capacitors 12. Respective pairs of bias resistors 13 are provided between the input terminals S4 and R4 of the respective single-ended Schmitt trigger circuits 14 and the coupling capacitors 12. The input terminals S4 and R4 of the respective single-ended Schmitt trigger circuits 14 are DC biased, by the bias resistors 13, to a voltage that is: intermediate between the ground level GND2 and a power-supply voltage VDD2. As an example, the power-supply voltage VDD2 in the present Embodiment 1 is 5 V, and the resistance values of the bias resistors 13 are all 25 kΩ; accordingly, the DC bias voltage is set to 2.5 V. Respective output, terminals S3 and R3 of the single-ended Schmitt trigger circuits 14 are connected to the RS flip flop 15.

The transmission circuit 23 operates with power from a power supply VDD1, being a first power supply. The transmission circuit 23 generates a transmission signal by means of the transmission pulse generation circuit 9, using an input signal IN outputted from outside.

The reception circuit 24 operates with power from, the power supply VDD2 being a second power supply. The reception circuit 24 receives the transmission signal outputted by the transmission circuit 23, via the transformer 22.

The transmission circuit 23 inputs a transmission-side voltage signal, made up of a single pulse, to the transmission terminal S1 of the transmission-side inductor 10 of the transformer 22a, in synchronisation, with the rising edge of the input signal IN, as illustrated in FIG. 2. The transmission circuit 23 inputs a transmission-side voltage signal made up of a single pulse to the transmission terminal R1 of the transmission-side inductor 10 of the transformer 22b, in synchronization with the falling edge of the input signal IN. These single pulses need not necessarily be single pulses, and may be made up of a plurality of pulses.

The transformer 22 and the reception circuit 24 are formed on the same chip, as illustrated in FIG. 16B described below.

An upper threshold voltage VSPH and a lower threshold voltage VSPL of the single-ended Schmitt trigger circuits 14 that make up the signal detection circuit are set to satisfy the two conditions below.

(Condition 1): The voltage at the terminals S2, R2 of the reception-side inductors 11 of the transformers 22a, 22b at no-signal, where no input signal IN is inputted (alternatively, the voltage at the terminals S4, R4 in a case where the bias resistors 13 are provided), lies between the upper threshold voltage VSPH and the lower threshold voltage VSPL of the single-ended Schmitt trigger circuits 14.

(Condition 2): The voltage at the terminals S2, R2 of the reception-side inductors 11 of the transformers 22a, 22b (alternatively, the voltage at the terminals S4, R4) is higher than the upper threshold voltage VSPH of the single-ended Schmitt trigger circuits 14, at the rising edge of the signal (transmission-side voltage signal) inputted to the transmission terminals S1, R1 of the transmission-side inductors 10 of the transformers 22a, 22b, and the voltage at the terminals S2, R2 (or the voltage at the terminals S4, R4) is lower than the lower threshold voltage VSPL of the single-ended Schmitt trigger circuits 14, at the falling edge of the above signal (transmission-side voltage signal).

Figure 4:
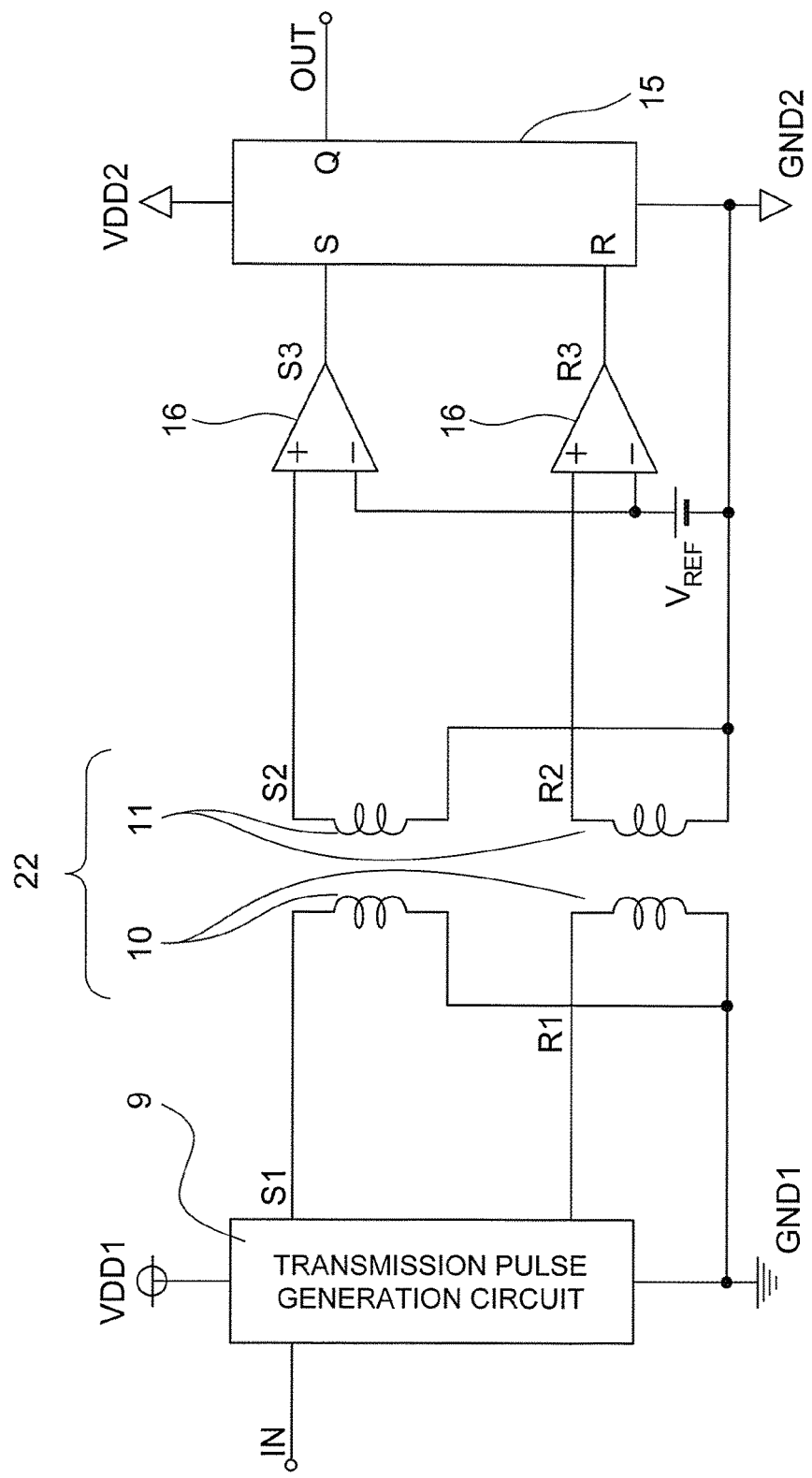
FIG. 4 is a circuit diagram illustrating a signal transmission circuit according to a comparative example for comparison with Embodiment 1 of the present invention.
Figure 5:
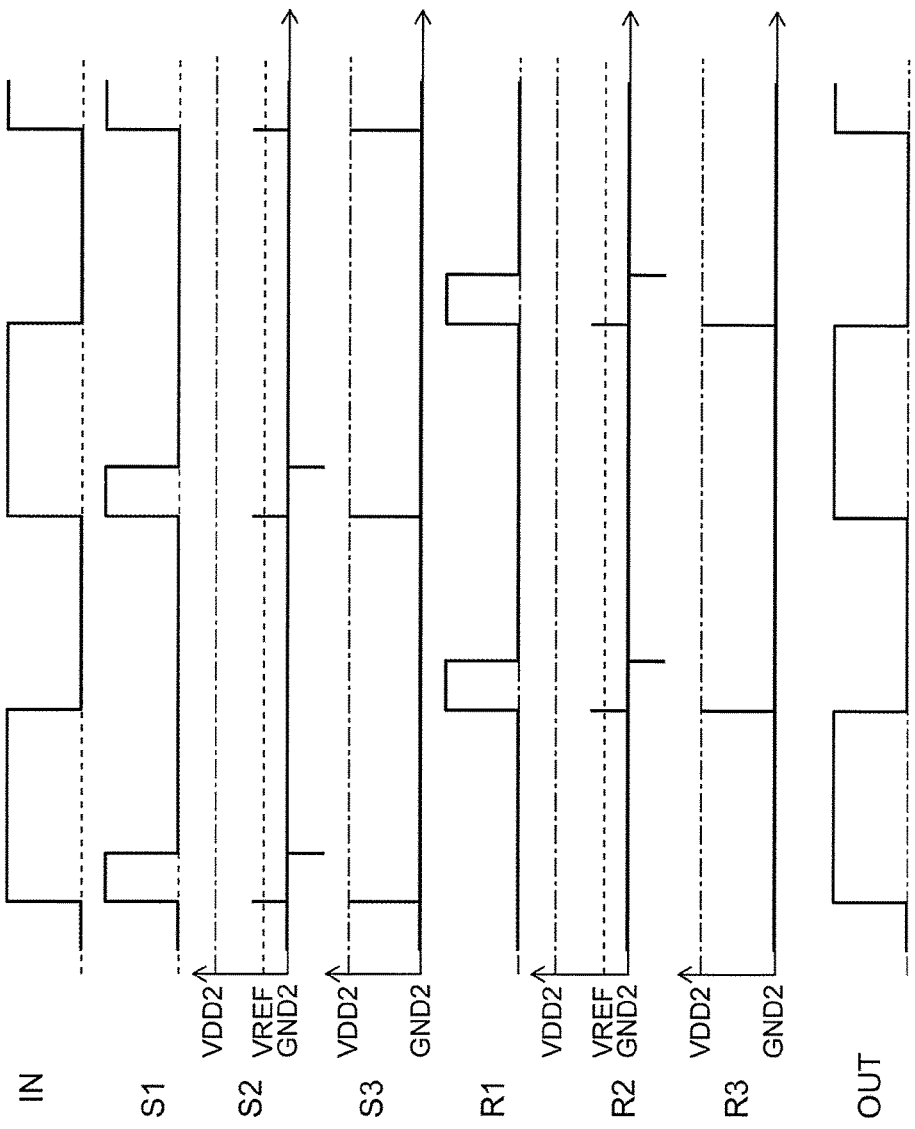
FIG. 5 is an explanatory diagram illustrating signal waveforms of a signal transmission circuit according to the comparative example for comparison with Embodiment 1 of the present invention.

FIG. 4 illustrates the configuration of a comparative example for comparison with the present Embodiment 1. FIG. 5 illustrates signal waveforms of the various units in the signal transmission circuit depicted in FIG. 4.

Figure 11B:
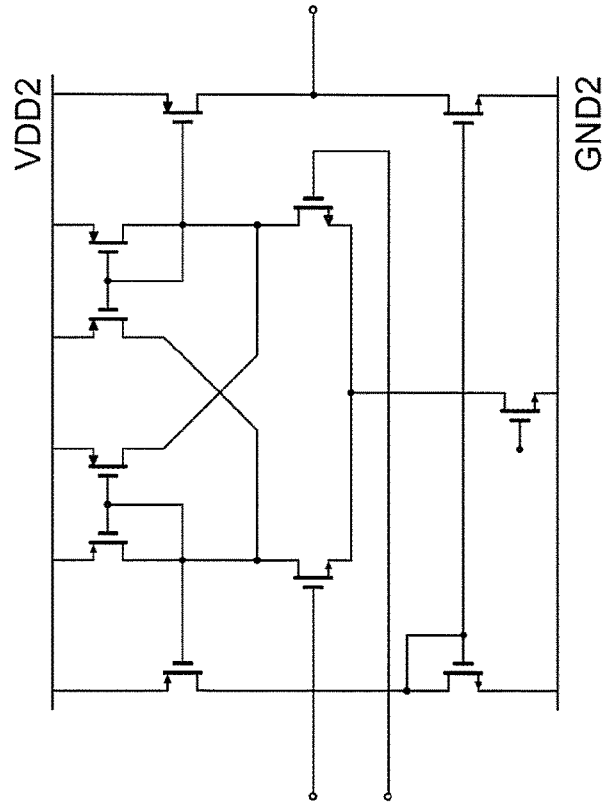
FIG. 11B is a diagram illustrating an example of a signal detection circuit.
Figure 11A:
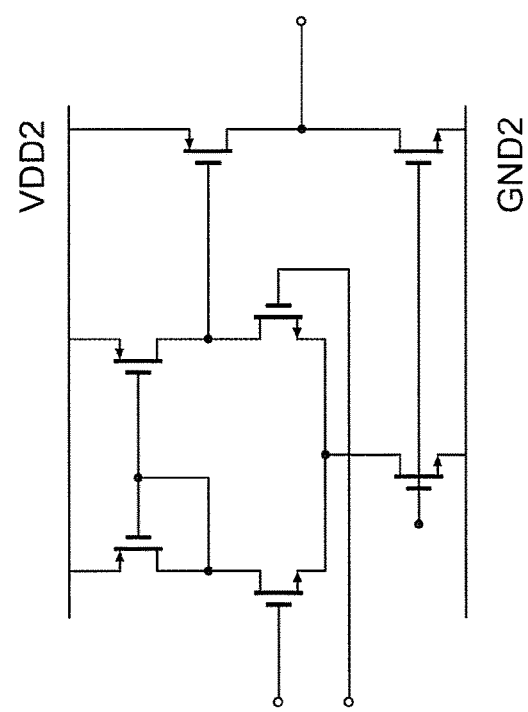
FIG. 11A is a diagram illustrating an example of a signal detection circuit.

The signal transmission circuit in the comparative example illustrated in FIG. 4 is made up of the transmission pulse generation circuit 9, the two transformers 23, signal detection circuits 16 and the RS flip flop 15. Unlike FIG. 1, the coupling capacitors 12, bias resistors 13 and single-ended Schmitt trigger circuits 14 illustrated in FIG. 1 are not provided in FIG. 4; instead, there are provided the signal detection circuits 16. One end of each reception-side inductor 11 of the transformer 22 is connected to ground GND2 on the reception side, and the other end (S2 and R2; is connected to an input terminal (+) of each signal detection circuit 16. The signal detection circuits 16 compare the S2 and R2 voltage inputted to the respective input terminals (+) with a reference voltage and output the comparison result. For instance, a differential input comparator is used as each of the signal detection circuits 16. FIG. 11A and FIG. 11B illustrate configuration examples of that differential input comparator. The output terminals S3 and R3 of the signal detection circuits 16 are connected to a set terminal (S) and a reset terminal (R) of the RS flip flop 15. The RS flip flop 15 outputs, to an output terminal OUT, signal voltage in accordance with the input at the set terminal (S) and the reset terminal (R).

FIG. 5 illustrates signal waveforms of the various units of the circuit of FIG. 4. The transmission pulse generation circuit 9 outputs a square wave (voltage pulse) to the terminal S1 at the rising edge of the input signal IN. The transmission pulse generation circuit 9 outputs a square wave (voltage pulse) to the terminal R1 at the falling edge of the input signal IN. Voltage is induced at the terminals S2 and R2 of the reception-side inductors 11 when a voltages pulse is applied to the transmission-side inductors 10 of the transformer 22. The signal detection circuits 16 compare the voltage at S2 and R2 with the reference voltage $V_{REF}$. If the voltage at S2 or R2 is higher than $V_{REF}$, the respective signal detection circuit 16 outputs a voltage (hereafter referred to as H) identical to the power-supply voltage VDD2. If on the other hand the voltage at S2 or R2 is lower than $V_{REF}$, the respective signal detection circuit 16 outputs to the terminals S3 or R3 a voltage (hereafter referred to as L) identical to the ground voltage GND2. The RS flip flop 15 outputs, to the output terminal OUT, voltage according to the input at the set terminal (S) and the reset terminal (R). The voltage according to the input at the set terminal (S) and the reset terminal (R) denotes herein a pulse signal the rising edge of which is the point in time at which the voltage from the terminal S3, inputted to the set terminal (S), is H, the failing edge of which is the point in time at which the voltage from the terminal R3, inputted to the reset terminal (R), is H. As a result, a voltage waveform identical to the input signal IN is reproduced at the output terminal OUT. In a conventional signal, transmission circuit, only positive pulses arc used in signal transmission, as can be seen from a comparison between S2 and S3 and between R2 and R3.

Figure 6:
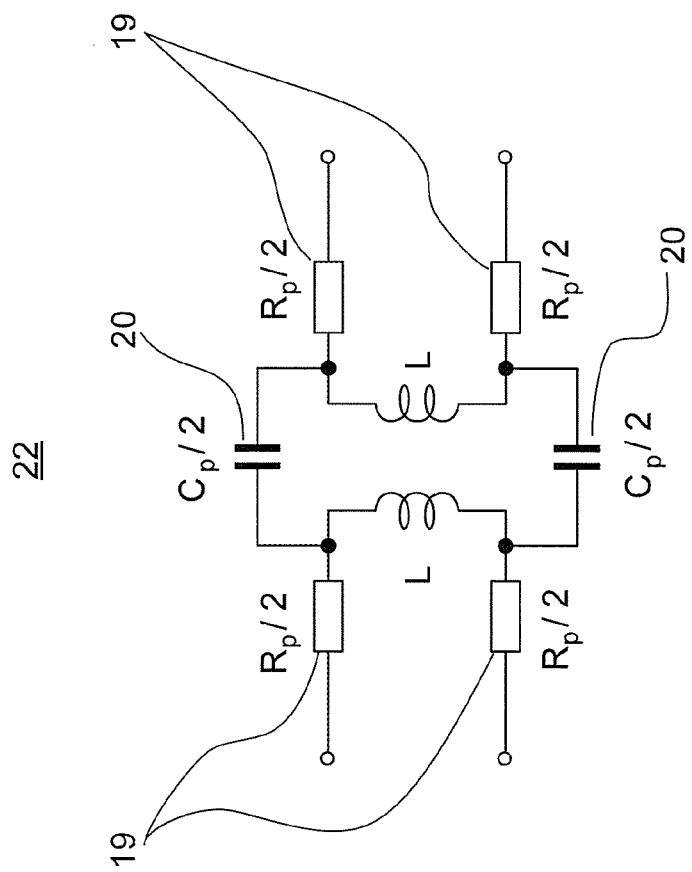
FIG. 6 is a diagram illustrating an equivalent circuit of the micro-transformers illustrated in FIG. 1 and FIG. 4.
Figure 7:
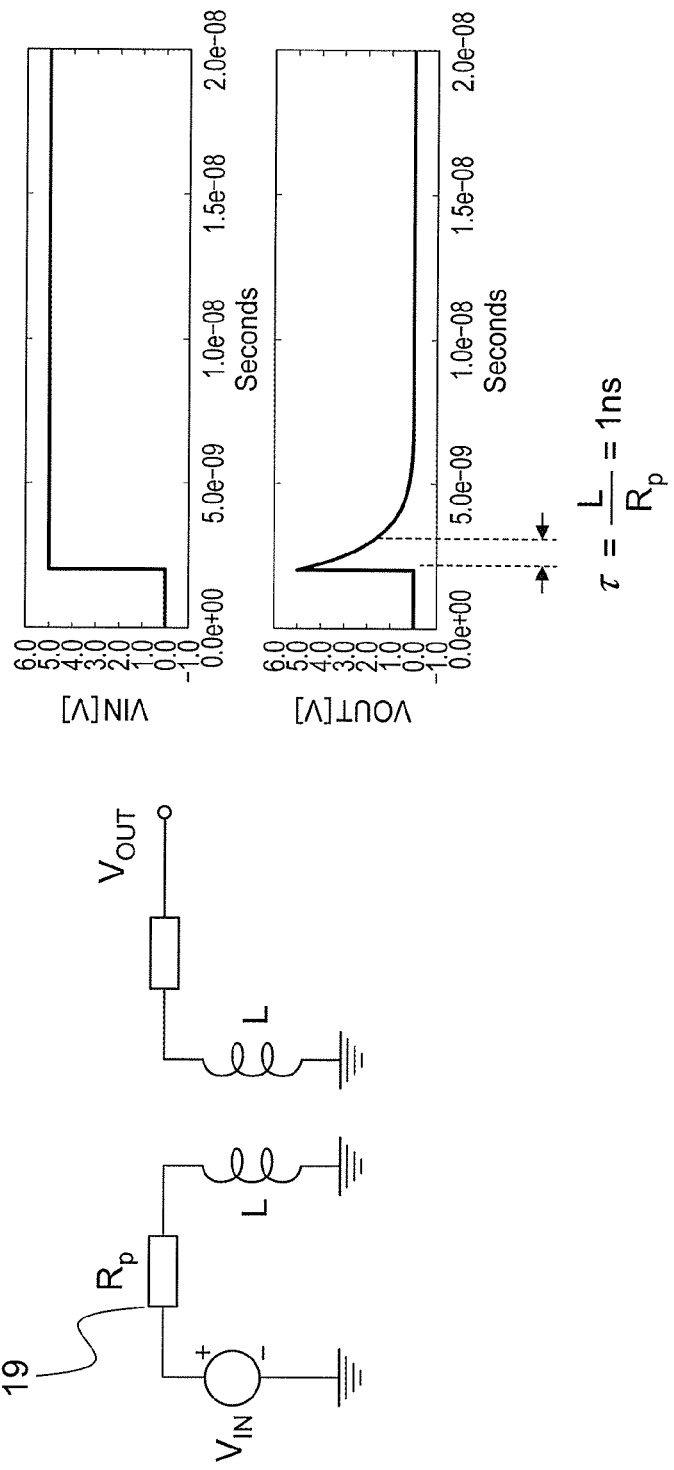
FIG. 7 is a diagram illustrating a step response of the micro-transformer illustrated in FIG. 6.

FIG. 6 illustrates an equivalent circuit of the transformer 22. The equivalent circuit of the transformer 22 illustrated in FIG. 6 is a micro-transformer created on an integrated circuit. The inductance L of such a micro-transformer is very small, of about 100 nH, while the parasitic resistance thereof is of about 100Ω. FIG. 7 illustrates the response of such a transformer to a step voltage input. The horizontal axes of the graphs of FIG. 7 represent time. The vertical axes of the graphs in FIG. 7 represent input voltage $V_{IN}$ and output voltage $V_{OUT}$ depicted in the circuit diagram of FIG. 7. As illustrated in FIG. 7, the voltage signal generated in the reception-side inductor is a very short pulse signal, having an attenuation time constant $\tau = L/R_p$ of 1 ns. The signal detection circuits 16 are required to have fast responsiveness in order to detect such short pulse signals.

Figure 8:
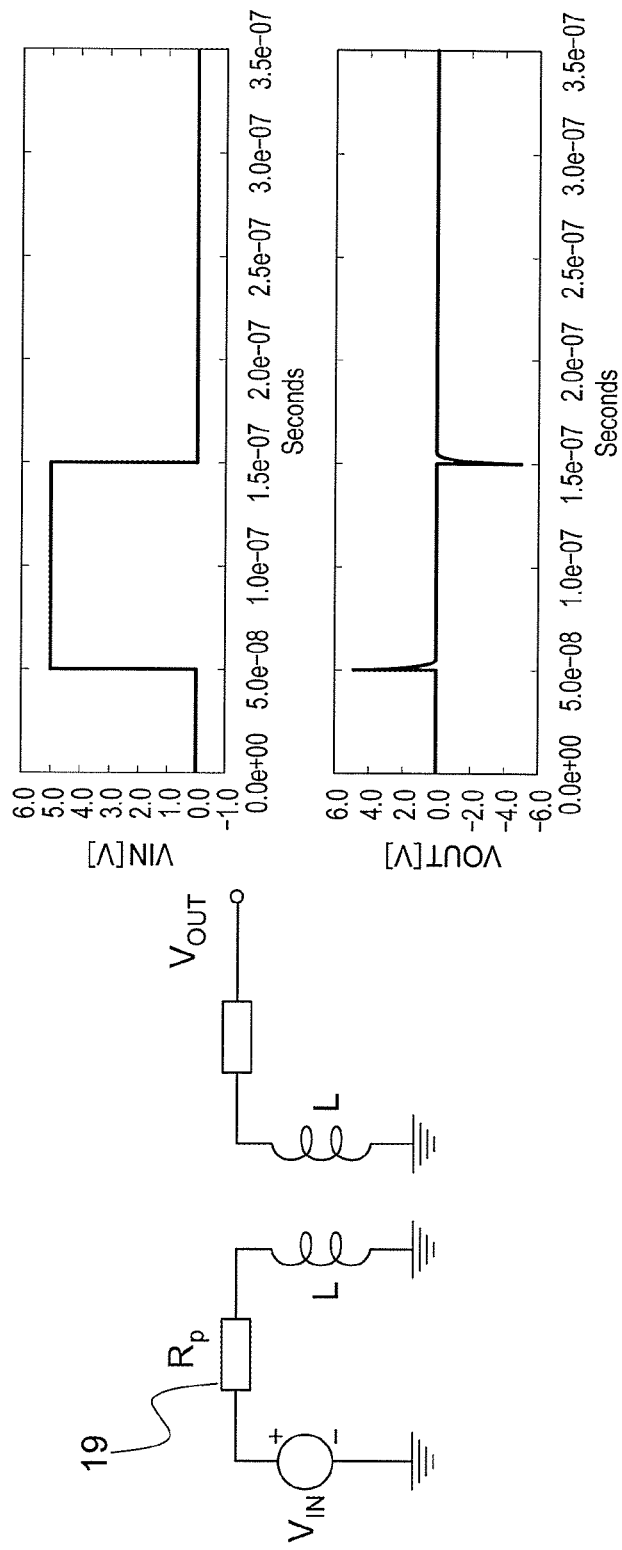
FIG. 8 is a diagram illustrating a transmission waveform and a reception waveform of the micro-transformer illustrated in FIG. 6.

FIG. 8 illustrates a signal waveform generated in the reception side of the transformers in an instance where a square wave is inputted to the transmission side of the transformer. The horizontal axes of the graphs of FIG. 8 represent time. The vertical axes of the graphs in FIG. 8 represent input voltage $V_{IN}$ and output voltage $V_{OUT}$ depicted in the circuit diagram of FIG. 8. As illustrated in FIG. 8, a positive signal and a negative signal are generated on the reception side in accordance with the rising and failing of the transmission-side square wave. In conventional signal transmission circuits signal transmission is carried out using only the positive pulse among the foregoing. In particular, in a conventional transmitting and receiving circuit such as the those disclosed in for instance PTL 2 and 3, the amplitude of the negative pulse is deliberately reduced, so that signal transmission is performed based on positive pulses alone, through shortening of the rising time and lengthening of the falling time or the transmission-side voltage waveform.

Differences between PTL 2 and 3 and the present Embodiment 1 will be explained below; the configurations of the transmitting and receiving circuits disclosed in PTL 2 and 3 will be explained first in brief.

In the circuit of PTL 2 (depicted in FIG. 3 of PTL 2), one pair of transformers is used to transmit a set signal and a reset signal, through modification of the direction of the current flowing in the transformers.

In the circuit illustrated in FIG. 16 of PTL 3, one end of a reception-side inductor is connected to a single-ended Schmitt trigger circuit via a capacitor. In this example there is only one transformer, and the set signal and the reset signal are distinguished through modification of the orientation of the current flowing in the transmission-side inductor.

In conventional technology such as that of PTL 2 and 3, the reception-side inductors 11 are DC biased to ground voltage or to power supply voltage. The underlying reasons for this are as follows.

Figure 3:
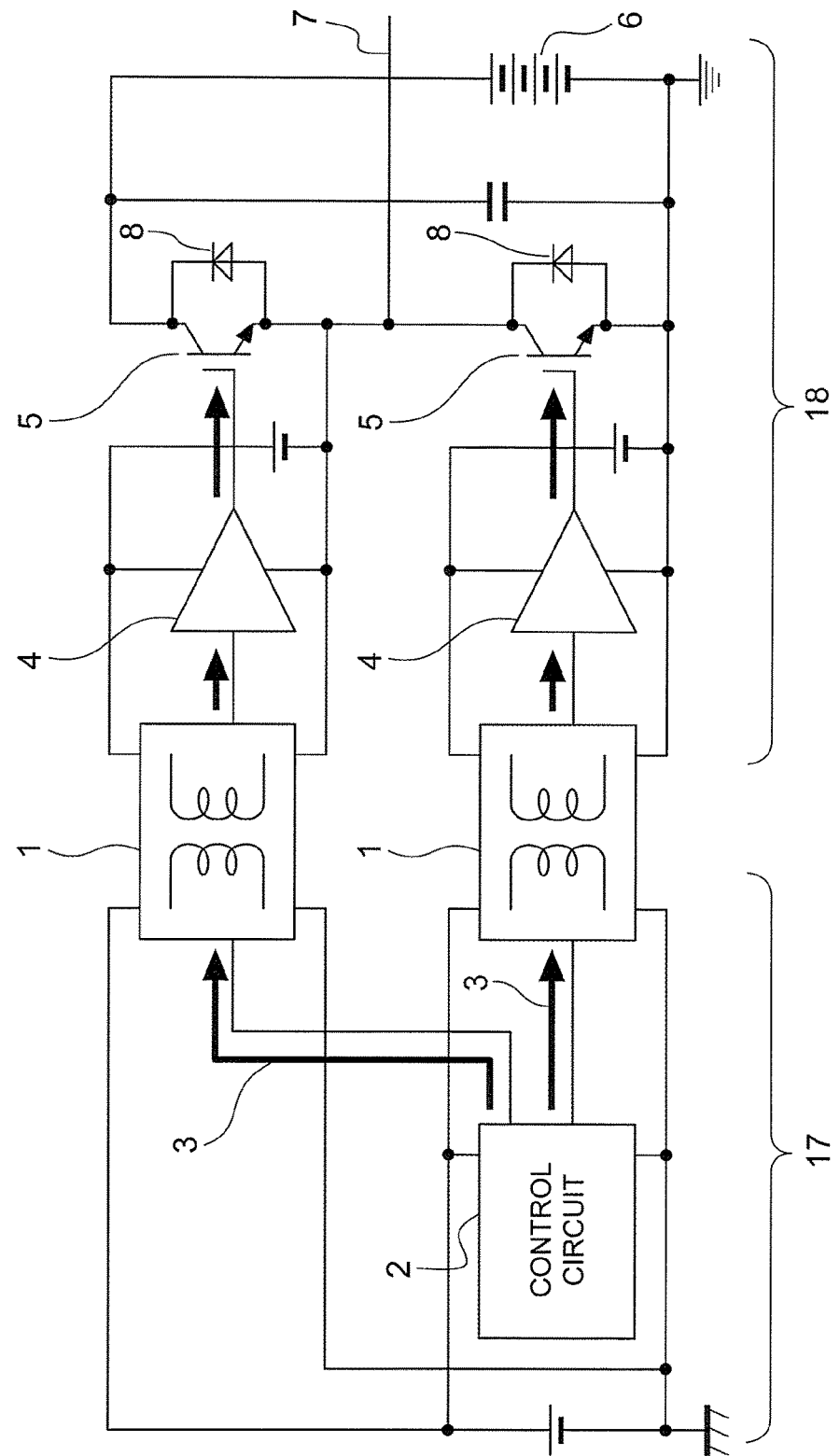
FIG. 3 is a circuit diagram illustrating an example of an embodiment in which a signal transmission device is used in a power conversion circuit.

FIG. 3 illustrates an example of an implementation where a signal transmission device 1 is used in a power conversion circuit. As illustrated in FIG. 3, the power conversion circuit has a low voltage region 17 and a high voltage region 18. A control circuit 2 is disposed in the low voltage region 17. The control circuit 2 is for instance made up of a microcomputer. In the high voltage region 18, there are disposed gate driving circuits 4, semiconductor switches 5, a high-voltage power supply 6, an AC output terminal 7 and free-wheeling diodes 8.

In order to prevent malfunction of the control circuit 2 and in order to prevent electric shock, the low voltages region 17 in which the control circuit 2 is disposed and the high voltage region 18 in which the semiconductor switches 5 are placed are electrically isolated from each other by signal transmission devices 1.

Gate driving signals 3 generated by the control circuit 2 are inputted to the gate driving circuits 4 by way of the signal transmission devices 1. The gate driving circuits 4 open and close the semiconductor switches 5 in accordance with the gate driving signals 3. Upon opening and closing of the semiconductor switches 5, AC voltage is generated, in a range from ground level to the voltage level (several hundred to several thousand V) that is generated by the high-voltage power supply 6, at the AC output terminal 7 of the power conversion circuit, in accordance with the duration of the ON state of the semi conductor switches 5.

Figure 9:
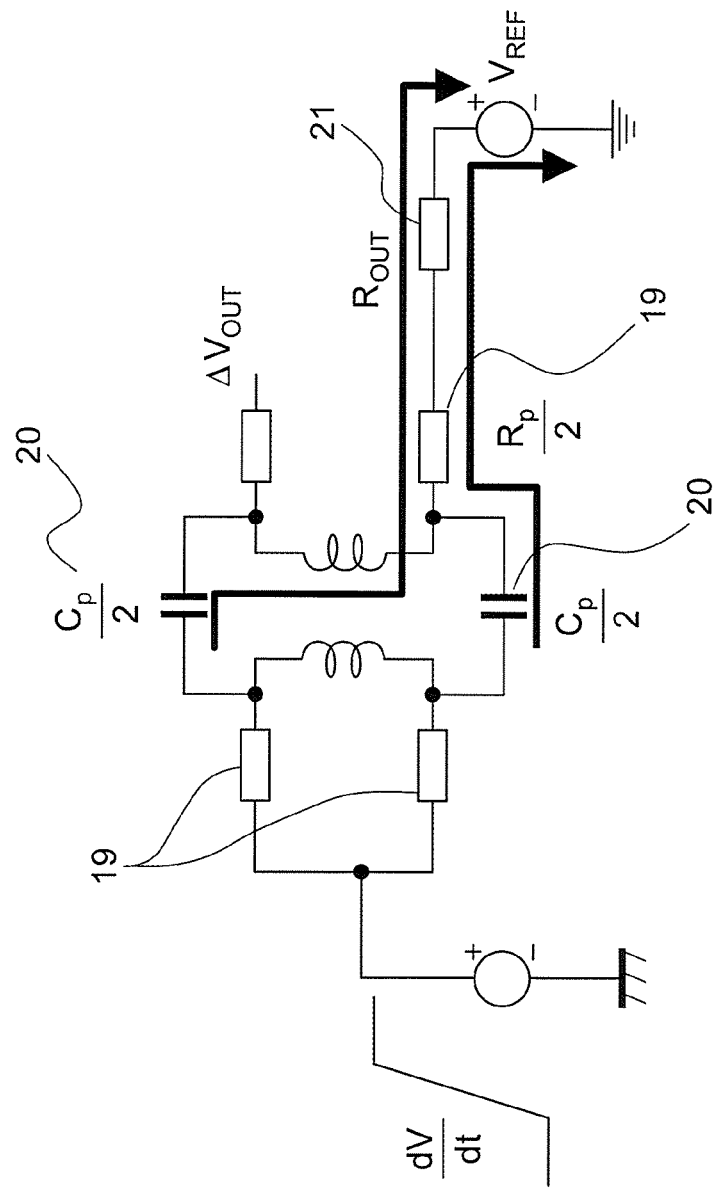
FIG. 9 is a diagram illustrating signal voltage generated by dV/dt noise.

Upon opening and closing of the semiconductor switches 5 in the power conversion circuit of FIG. 3, the voltage at the AC output terminal 7 varies within a range from the ground level up to the voltage generated by the high-voltage power supply 6. In this case the ground of the gate driving circuits 4 is connected to the AC output terminal 7, and accordingly a large voltage (hereafter referred to as input common-mode voltage V) is applied, at every switching, across the transmission side and the reception side of the signal transmission device 1. This is referred to as dV/dt noise. Herein dV/dt is the rate of change of the input common-mode voltage V. Accordingly, the maximum value of dV/dt takes on a value of allowable rate of change of the input common-mode voltage V. When dV/dt noise is applied across the transmission side and the reception side of each signal transmission device 1, current flows to transformer parasitic resistances 19 and to an output resistance 21 of the DC bias circuit, via transformer parasitic capacitances 20, as illustrated in the equivalent circuit of FIG. 9, whereby the output voltage $V_{OUT}$ is generated at an reception side signal end. The equivalent resistance $R_{eq}$ at the portion where current flows due to the dV/dt noise is $R_{eq}=(R_p/2+R_{OUT})$, where Rp is the value of the trans Cornier parasitic resistances 19 and $R_{OUT}$ is the output resistance 21 of the DC bias circuit. The value $V_{OUT}$ of noise voltage generated at the transformer reception end is $V_{OUT}=C_p(dV/dt)R_{eq}$, where $C_p/2$ is the value of the transformer, parasitic capacitances 20. In the following estimation there are set $R_p=100\Omega$ and $C_p=300$ fF. As illustrated in FIG. 10A, the output resistance $R_{OUT}$ of DC bias resistance is 12.5 k$\Omega$ in a case where power-supply voltage of 5 V is split by two 25 k$\Omega$ resistors and the reception-side inductor is biased to 2.5 V; hence, the equivalent resistance is $R_{eq}=12.55$ k$\Omega$, and the signal voltage generated at the transformer reception end becomes about 90 V on account of the dV/dt noise of 25 kV/µs. This voltage takes on a value significantly larger than that of the power-supply voltage of the reception circuit. In a case where by contrast the reception-side inductor is DC biased to ground level, there holds $R_{eq}=R_p/2=50\Omega$, and the signal voltage generated at the transformer reception end decreases significantly, to about 0.4 V, as illustrated in FIG. 10B. Herein DC biasing of the reception-side inductor to ground level or to power supply level is preferable in order to prevent malfunction of the reception circuit due to dV/dt noise. The horizontal axes of the graphs of FIG. 10A and FIG. 10B represent time. The vertical axes of FIG. 10A and FIG. 10B represent input voltage $V_{IN}$ and output voltage $V_{OUT}$.

Figure 12A:
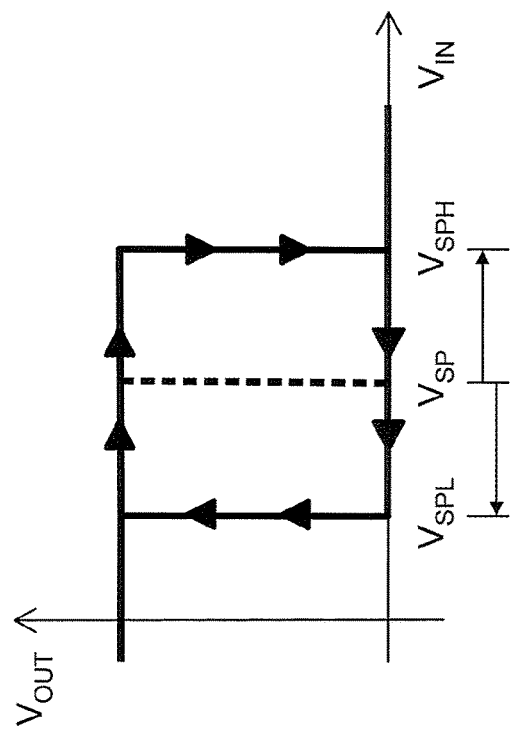
FIG. 12A is a diagram illustrating the operation of a single-ended input Schmitt trigger circuit provided in the signal transmission device according to Embodiment 1 of the present invention.
Figure 12B:
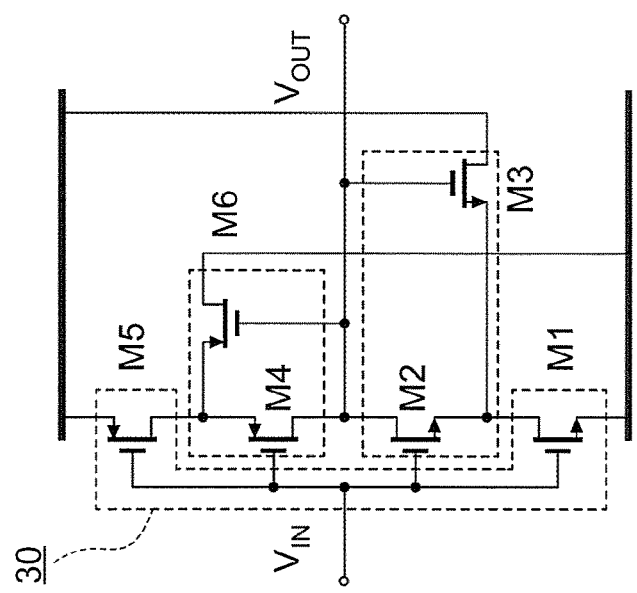

The operation of the signal transmission device 1 of Embodiment 1 of the present invention will be explained next with reference to FIG. 1 and FIG. 2. The transmission pulse generation circuit 9 generates a pulse at the terminal S1, at the rising edge of the input signal IN, and simultaneously therewith, generates a pulse at the terminal R1, at the falling edge of the input signal IN. Voltage signals are generated at the terminals S2 and R2 on the reception side of the transformer 22 in accordance with the voltage at the terminals S1 and R1 on the transmission side of the transformer 22. As illustrated in FIG. 2, the voltage 1 signals generated at the terminals S2 and R2 are a positive pulse and a negative pulse centered on the ground level. These pulses are level-shifted, via the coupling capacitors 12, to the DC level generated by the bias resistors 13, to yield signals at the terminals S4 and R4. These signals constitute input signals of the single-ended Schmitt trigger circuits 14. FIG. 12A illustrates the circuit configuration of the single-ended Schmitt trigger circuits 14. In the example of FIG. 12A, the single-ended Schmitt trigger circuits 14 are each made up of three NMOSs. (M1, M2, M3) and three PMOSs (M4, M5, M6). Unlike the differential input comparator illustrated in FIG. 11A and FIG. 11B, the circuit in FIG. 12A has only one input terminal. The designation single-ended denotes herein a circuit to which there is inputted a voltage signal making ground level as a reference, and is a comparative designation with respect to a circuit the input of which is a voltage difference across two input terminals, as in FIG. 11A and FIG. 11B. FIG. 12B illustrates the operation of the single-ended Schmitt trigger circuits 14. FIG. 12B is a relationship between the input voltage $V_{IN}$ and the output voltage $V_{OUT}$. In FIG. 12B, the horizontal axis represents the input voltage $V_{IN}$ and the vertical axis represents the output voltage $V_{OUT}$. The central element in the circuit configuration of FIG. 12A is a CMOS (Complementary Metal-Oxide-Semiconductor) inverter 30 made up of M1 and M5. In the CMOS inverter 30 made up of M1 and M5 alone, the output voltage $V_{OUT}$ is H in a case where input voltage $V_{IN}$ is lower than a threshold value determined in advance, and the output voltage $V_{OUT}$ is L in a case where the input voltage $V_{IN}$ is higher than the above threshold value. The input voltage for which the output voltage $V_{OUT}$ changes from H to L is a switching point voltage $V_{SP}$. In the circuit of FIG. 12A, M2 and M3 fulfill the function of shifting the switching point voltage $V_{SP}$ to the switching point voltage $V_{SPH}$ on the high voltage side, when the input $V_{IN}$ changes from L to H, and M4 and M5 fulfill the function of shifting the switching point voltage to the switching point voltage $V_{SPL}$ on the low voltage side when the input voltage changes from H to L.

Figure 13B:
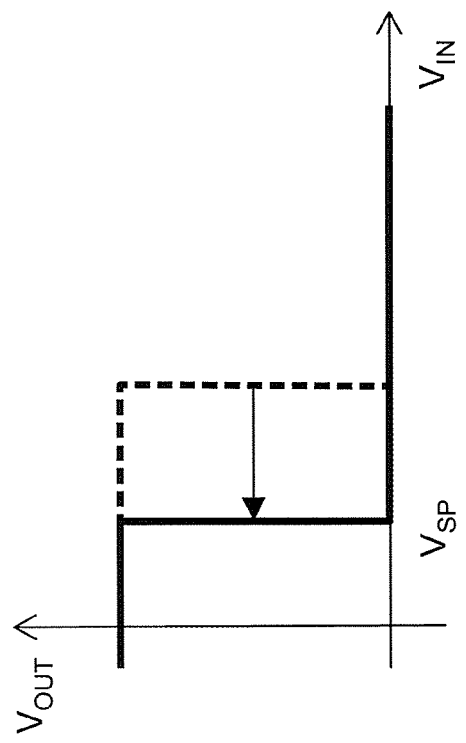
FIG. 13B is an explanatory diagram illustrating an increase in delay time in a case of lowered threshold voltage of a CMOS inverter.
Figure 13A:
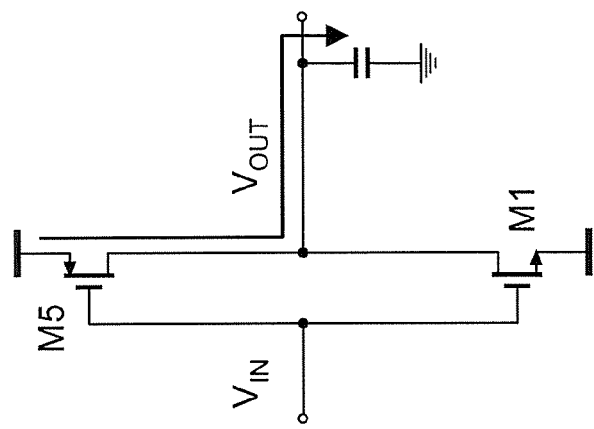
FIG. 13A is an explanatory diagram illustrating an increase in delay time in a, case of lowered threshold voltage of a CMOS inverter.

In the circuit of FIG. 1, the following problem arises in a case where the coupling capacitors 12 and bias resistors 13 are absent and one end of each of the reception-side inductors 11 is directly connected to the input terminal of a respective single-ended Schmitt trigger circuit 14. Current that can flow in the transmission-side inductors 10 has an upper limit, since current consumption cannot be too large. Meanwhile, the signal voltage generated at the reception-side inductors 11 is often ½ or less of the power-supply voltage. In this case, it is necessary to reduce the switching point voltages $V_{SPH}$ and $V_{SPL}$ of the single-ended Schmitt trigger circuits 14 to be lower than ½ of the power-supply voltage. Herein, $V_{SPH}$ is higher than the switching point voltage $V_{SP}$ of the CMOS inverter 30 made up of M1 and M5, and $V_{SPL}$ is lower than $V_{SP}$. Accordingly, also the switching point voltage $V_{SP}$ of the CMOS inverter 30 has to be set to be smaller than ½ of the power-supply voltage. In this case it is necessary to set the current driving power of M5 to be smaller than that of M1, as illustrated in FIG. 13A and FIG. 13B; as a result, the time required to charge the output terminal becomes longer, and in consequence the delay time during change of the output voltage from L to H is lengthened as well, and a signal pulse having a pulse width of about 1 ns can no longer be followed.

In Embodiment 1 of the present invention, by contrast, the DC bias level is shifted to about ½ of the power-supply voltage toy the coupling capacitors 12 and the bias resistors 13, as illustrated in FIG. 1. Accordingly, it is not necessary to set the switching point voltages $V_{SPH}$ and $V_{SPL}$ to be close to ground voltage, and the problem of lengthened delay time of the single-ended Schmitt trigger circuits 14 does not arise.

The differential input comparator illustrated in FIG. 11A and FIG. 11B can be used in a signal detection circuit even if the signal voltage generated in the reception-side inductors 11 is ½ or less of the power-supply voltage. However, in order to detect a signal pulse whose pulse width is about 1 ns using the differential input comparator it is necessary to cause current of about 1 mA to flow constantly in the comparator, and thus power consumption in the reception circuit increases, which is problematic.

In a conventional signal transmission circuit only positive pulses are used in signal transmission. Accordingly, both the high voltage-side switching point $Y_{SPH}$ and the low voltage-side switching point voltage $V_{SPL}$ are set to lie within the amplitude of a positive pulse, as illustrated in FIG. 14A. On the other hand, in the present Embodiment 1, both positive pulses and negative pulses are used in signal transmission, and accordingly voltage setting is performed in such a manner that positive pulses cut across the high voltage-side switching point $V_{SPH}$ and negative pulses cut across the low voltage-side switching point voltage $V_{SPL}$, as illustrated in FIG. 14B. Thus, the request for delay time to be satisfied by the single-ended Schmitt trigger circuits 14 is relaxed through setting of the switching point voltages $V_{SPH}$, $V_{SPL}$. FIG. 15A and FIG. 15B illustrate this feature. In a case where only positive pulses are used in signal transmission, as in conventional instances, the output signal of the comparator must change from H to L during a short time $t_A$ from the point in time at which the voltage at the terminal S2 of the reception-side inductor exceeds $V_{SPH}$ until the voltage drops below $V_{SPL}$, as illustrated in FIG. 15A. On the other hand, in the signal transmission device of the present Embodiment 1, by contrast, both positive pulses and negative pulses are used in signal transmission; accordingly, it suffices that the output signal of the comparator changes from H to L, in the lapse of time $t_S$ of FIG. 15B, and hence signal transmission is possible even when using a Schmitt trigger circuit having a longer (slower) delay time.

FIG. 24A and FIG. 24B illustrate the definition of the delay time of a Schmitt trigger circuit. As illustrated in FIG. 24A, $t_{pdLH}$ is the delay time from the point in time at which the input signal S4 of the Schmitt trigger circuit exceeds $V_{SPH}$ until an output signal S3 of the Schmitt trigger circuit drops below: the threshold voltage of a next-stage logic circuit, and as illustrated in FIG. 24B, is the delay time from the point in time at which the input signal S4 of the Schmitt trigger circuit drops below until the output signal S3 of the Schmitt trigger circuit exceeds the threshold voltage of the next-stage logic circuit. The delay time of the Schmitt trigger circuit varies depending on variability in the semiconductor production process, the temperature and the power-supply voltage, and also on the value of parasitic capacitance derived from wiring delay. In a case where, due to such variability, the delay time of the Schmitt trigger is longer than an dipper limit value determined in advance, the output S3 of the Schmitt trigger circuit does not reach a next-stage logic threshold voltage, as illustrated in FIG. 23, and malfunction occurs. In order to prevent such a malfunction caused by variability in delay time it is necessary to set the switching point voltages as in the present Embodiment 1 illustrated in FIG. 14B, and to perform signal transmission using both positive and negative pulses.

Figure 17:
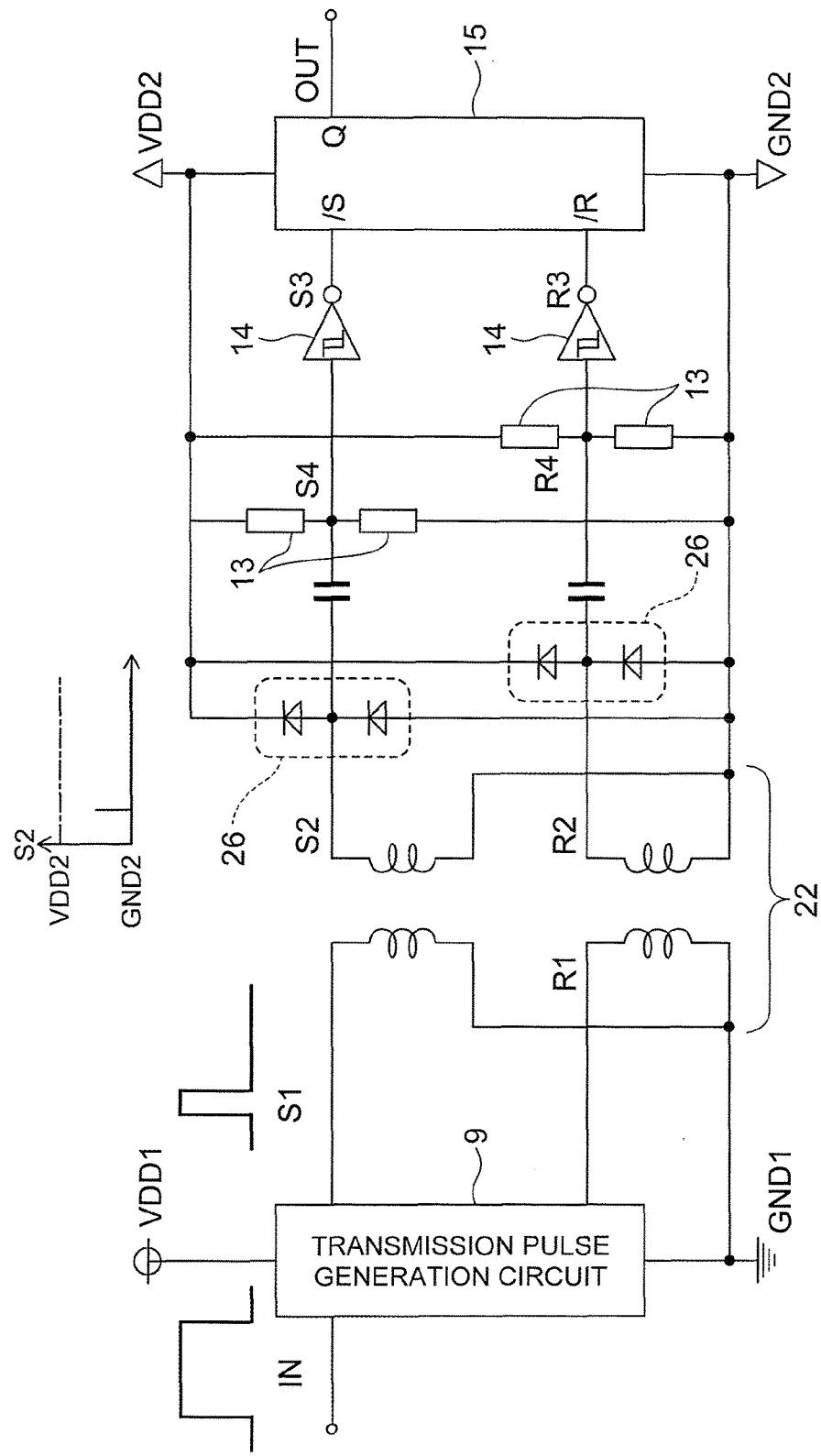
FIG. 17 is a circuit diagram illustrating a configuration resulting from, adding ESD protective elements.

The chip configuration as well must be modified in order to perform signal transmission using both positive pulses and negative pulses. FIG. 16B illustrates the chip configuration of the signal transmission circuit of the present Embodiment 1. As illustrated in FIG. 16B, in the signal transmission circuit of the present Embodiment 1 the transformer 22 and the reception circuit 24 are configured on the same chip. If the transformer 22 and the reception circuit 24 are configured in separate chips, as illustrated in FIG. 16A, the transformer 22 and the reception circuit 24 are connected by wires 25. In this case, in order to prevent breakage of the chip caused by electrostatic discharge (ESD), ESD protective elements 26 must be added to the transformer connection unit of the reception circuit 24, as illustrated in FIG. 17. Herein, diodes connected as the ESD protective elements 26 are forward-biased, and accordingly no negative voltage arises, at the terminal S2 of the reception-side inductor, that exceeds the forward voltage of the diodes, even if negative voltage arises in the terminal S2. Therefore, negative pulses generated in the reception-side inductors 11 cannot be used in signal transmission. In the present Embodiment 1, however, the transformer 22 and the reception circuit 24 are configured in the same chip, as illustrated in FIG. 16B, and accordingly it becomes possible to use, for signal transmission, a negative pulse generated at the terminal S2 of the reception-side inductors 11, without the need for adding the ESD protective elements 26 to the transformer connection terminals of the reception circuit 24.

The switching point voltages of the single-ended Schmitt trigger circuits 14 in the present Embodiment 1 are set as follows. A setting is adopted such that, even if there is inputted a maximum allowable dV/dt noise, the noise voltage generated on account of the current flowing in the transformer parasitic capacitances 20 and the transformer parasitic resistances 19 does not exceed the switching point voltages of the single-ended Schmitt trigger circuits 14. Specifically, the switching point voltages of the single-ended Schmitt trigger circuits 14 are set so that there hold $V_{DC}+C_p(dV/dt)\ (R_p/2)<V_{SPH}$ and $V_{DC}-C_p(dV/dt)\ (R_p/2)>V_{SPL}$. Herein $V_{DC}$ denotes the input DC bias voltage of the single-ended Schmitt trigger circuits 14. As a result, absence of malfunction is guaranteed in that the voltage induced in the reception-side inductors 11 does not exceed the switching point voltages of the single-ended Schmitt trigger circuits 14, even upon application of dV/dt noise, As an example, the upper threshold voltage of the single-ended Schmitt trigger circuits 14 is set in the present Embodiment 1 to 3.5 V and the lower threshold voltage $C_{SPL}$ is set to 1.5 V. Further, $V_{DC}$ is 2.5 V, $C_p$ is 300 fF and $R_p$ is 100Ω. Accordingly, there holds $C_p(dV/dt)\ (R_p/2)=0.375$ V when dV/dt=25 kV/μs, and the above conditions are satisfied.

The circuit of PTL 2 and the circuit of the present Embodiment 1 are compared next. In the circuit of PTL 2 (depicted in FIG. 3 of PTL 2) one transformer is used to transmit a set signal and a reset signal through modification of the direct ion of the current flowing in the transformer. Accordingly, a single-ended Schmitt trigger circuit cannot be used, and it is necessary to use a differential input comparator for signal detection. Therefore, power consumption is increased. On the other hand, in the present Embodiment 1, two transformers are provided, and the set signal and the reset signal are transmitted using separate transformers. This is advantageous in that, as a result, it becomes possible to utilize the single-ended Schmitt trigger circuits 14, and to reduce power consumption.

The circuit of PTL 3 and the circuit of the present Embodiment 1 will be compared next. In the circuit illustrated in FIG. 16 of PTL 3, one end of a reception-side inductor is connected to a single-ended Schmitt trigger circuit via a capacitor, in this example, there is only one transformer, and the set signal and the reset signal are distinguished through modification of the orientation of the current flowing in the transmission-side inductor. Further, it is necessary to perform control for increasing the rising rate and decreasing the falling rate of the transmission voltage, which entails a complex transmission circuit. On the other hand, in the present Embodiment 1 it is not necessary to control, the rising rate or the falling rate in the voltage waveform that is applied to the transmission side, and control can foe accomplished by relying on a simple circuit configuration. In the configuration of FIG. 6 of PTL 3 a circuit is required for modifying the transmission voltage waveform using a combination of a PWM signal and a clock signal, and the transmission circuit becomes yet more complex. The circuit of the present Embodiment 1 is superior in terms of circuit scale.

Figure 18:
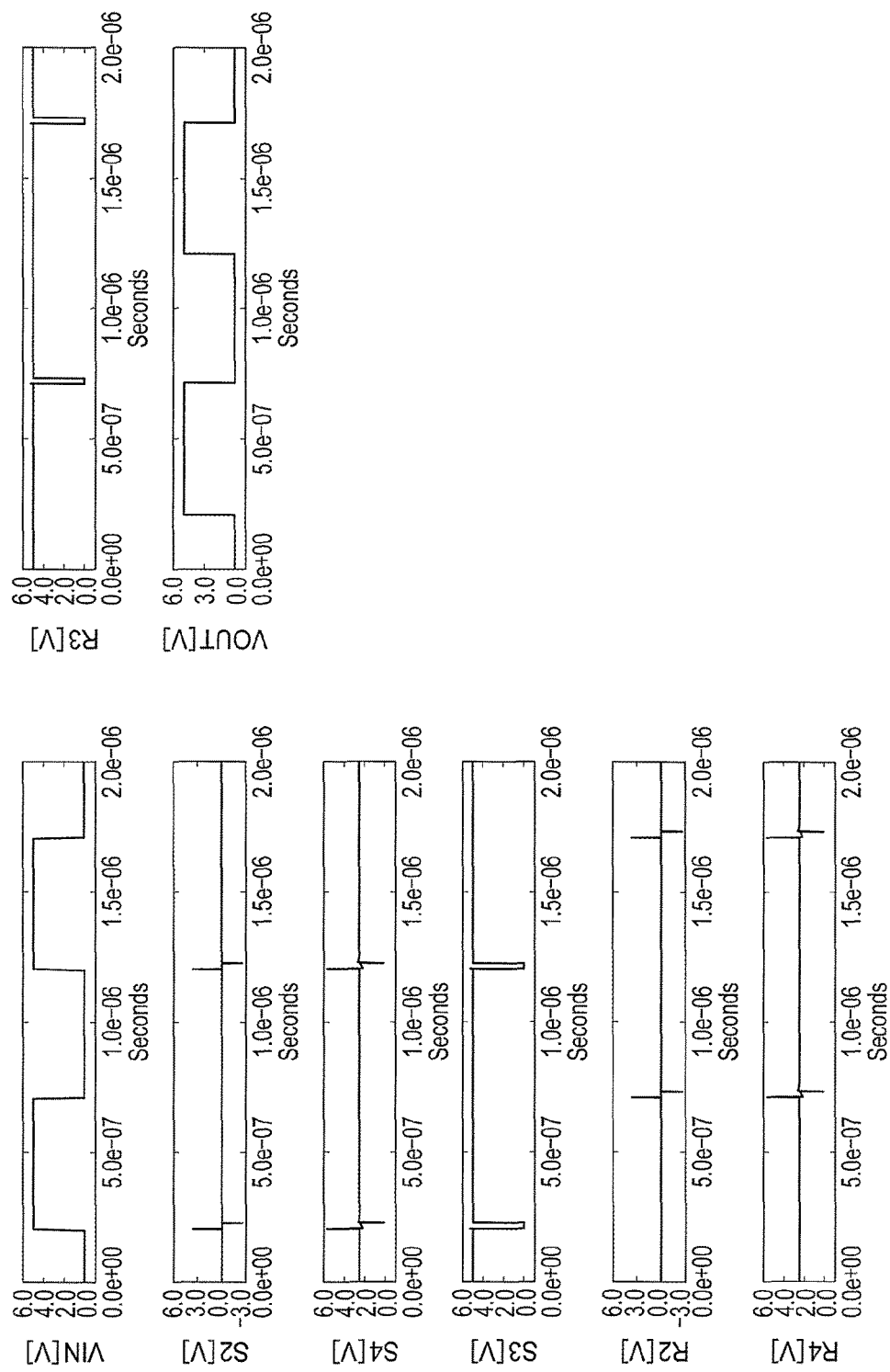
FIG. 18 is an explanatory diagram illustrating simulation results of the operation of the signal transmission device according to Embodiment 1 of the present invention.

Lastly, FIG. 18 illustrates simulation results in a case where a gate driving signal is transmitted using the signal transmission circuit of the present Embodiment 1. The horizontal axes of the graphs of FIG. 18 all denote time. The reference symbols in the vertical axes correspond to respective terminals of FIG. 1. Further, VIN denotes input voltage and VOUT denotes output voltage. As FIG. 18 reveals, the output signal S3 of the single-ended Schmitt trigger circuits 14 has a constant pulse width, since signal transmission is performed using both the positive pulses and the negative pulses of a voltage signal S2 that is generated in the reception-side inductors 11.

Figure 19:
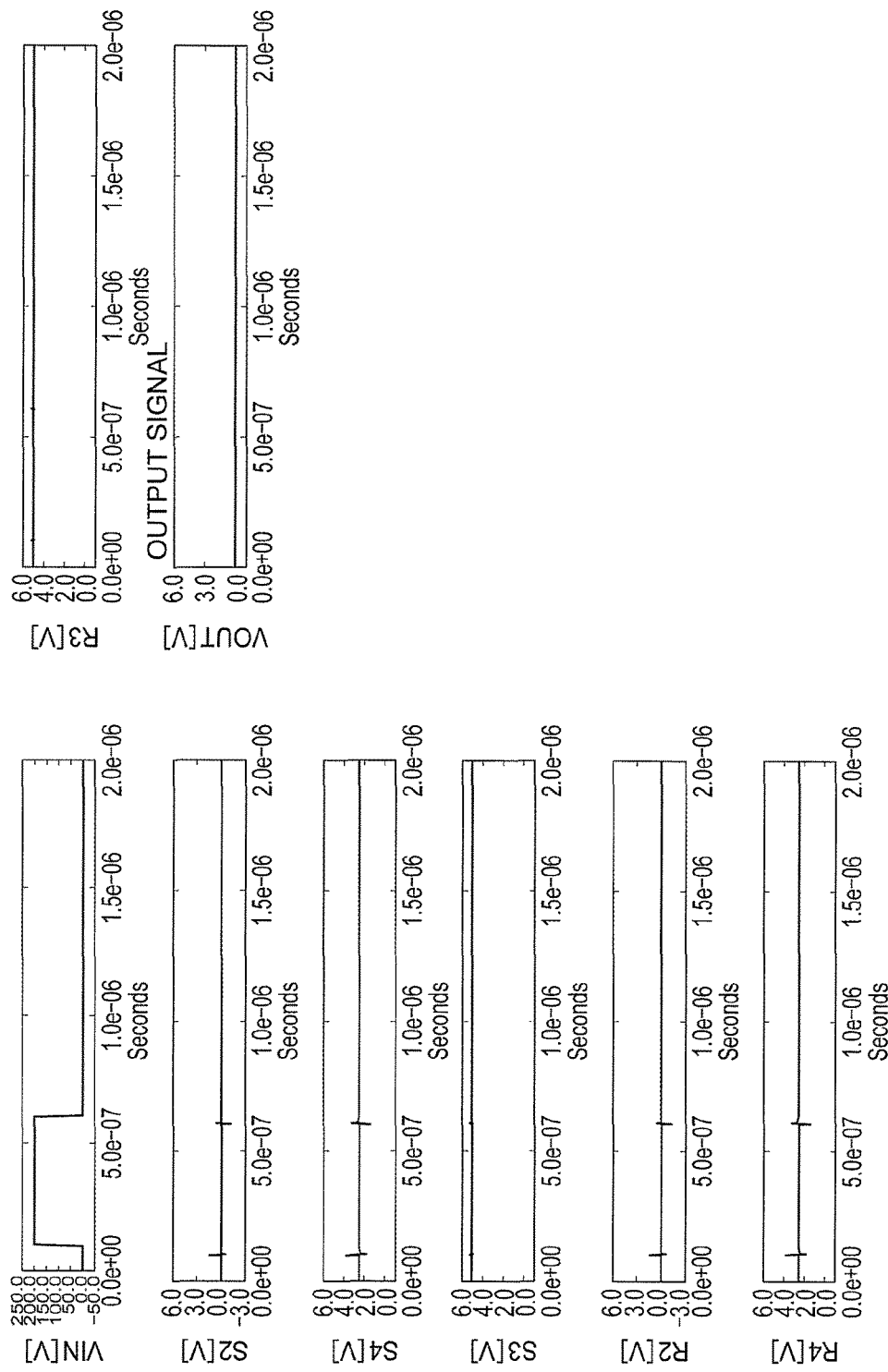
FIG. 19 is an explanatory diagram illustrating simulation results of the influence of dV/dt noise on the signal transmission device according to Embodiment 1 of the present invention.

FIG. 19 illustrates simulation results of instances where dV/dt noise of 25 kV/μs is applied to the signal transmission circuit of the present Embodiment 1. The horizontal axes of the graphs of FIG. 19 all denote time. The reference symbol is in the vertical axes correspond to respective terminals of FIG. 1. Further, VIN denotes input voltage and VOUT denotes output voltage. As illustrated in FIG. 19, dV/dt noise having amplitude of 200 V and rising and falling times of 8 ns is applied to VIN. The simulation results reveal that the voltage signal generated in the reception-side inductors n is very slight, despite the large dV/dt noise that is applied, and no circuit malfunction occurs in that the output signal S3 of the single-ended Schmitt trigger circuits 14 does not invert.

In the transmission circuit 23 of the present Embodiment 1, thus, a transmission-side voltage signal made up of one or a plurality of pulses is inputted to the transmission terminal S1 of the transmission-side inductor 10 of the transformer 22a, in synchronization with the rising edge of the input signal IN, and a transmission-side voltage signal made up of one or a plurality of pulses is inputted to the transmission terminal R1 of the transmission-side inductor 10 of the transformer 22b, in synchronization with the falling edge of the input signal as illustrated in FIG. 2. One terminal of the two terminals of each of the reception-side inductors 11 of the transformers 22a, 22b is connected to the power supply VDD2 or ground of the reception circuit 24, and the other terminal of the two terminals is connected to the input terminal of the signal detection circuit of the reception circuit 24 via the coupling capacitors 12. The above signal detection circuit is made up of the single-ended Schmitt trigger circuits 14. As illustrated in FIG. 2, the upper threshold voltage VSPH and the lower threshold voltage VSPL of the single-ended Schmitt trigger circuits 14 are set in such a manner that the voltage at the terminals S2, R2 (or S4, R4) of the reception-side inductors 11 of the transformers 22a, 22b at no-signal, where, no input signal IN is inputted, lies between the upper threshold voltage VSPH and the lower threshold voltage VSPL of the single-ended Schmitt trigger circuits 14, the voltage at the terminals S2, R2 (or S4, R4) of the reception-side inductors 11 of the transformers 22a, 22b is higher than the upper threshold voltage VSPH of the single ended Schmitt trigger circuits 14, at the rising edge of the transmission-side voltage signal that is inputted to the transmission terminals S1, R1 of the transmission-side inductors 10 of the transformers 22a, 22b, and the voltage at the terminals S2, R2 (or S4, R4) of the reception-side inductors 11 of the transformers 22a, 22b is lower than the lower threshold voltage VSPL of the single-ended Schmitt trigger circuits 14, at the falling edge of the transmission-side voltage signal that is inputted to the transmission terminals S1, R1 of the transmission-side inductors 10 of the transformers 22a, 22b. Further, the transformer 22 and the reception circuit 24 are formed on the same chip, as illustrated in FIG. 16B.

In the present embodiment, thus, the transformers 22a, 22b and the reception circuit 24 are formed on the same chip, and accordingly the ESD protective element connected to the transformer connection terminals of the reception circuit 24 can foe omitted. Therefore, a negative pulse generated in the reception-side inductors 11 can be used in signal transmission. Accordingly, it becomes possible to achieve signal transmission using both positive pulses and negative pulses, and to perform a stable signal transmission operation also in case of delay time variability in the signal detection circuit.

Further, a reception circuit of low power consumption can be configured by using single-ended Schmitt trigger circuits in the signal detection circuit.

In the present Embodiment 1, the upper threshold voltage VSPH of the single-ended Schmitt trigger circuits 14 is set to be higher than the voltage that is generated when current of a value resulting from multiplying a transformer parasitic capacitance Cp of the transformers 22a, 22b and an allowable rate of change dV/dt of the input common-mode-voltage V is caused to flow through the transformer parasitic capacitances 20 of the reception-side inductors 11 and the bias resistors 13 of a DC bias setting circuit, provided in the reception-side inductors 11. An effect is elicited as a result whereby of precluding the malfunction that occurs as the input voltage of the signal detection circuit fails to reach a switching point voltage, even when, dV/dt noise is applied.

Embodiment 2

Figure 20:
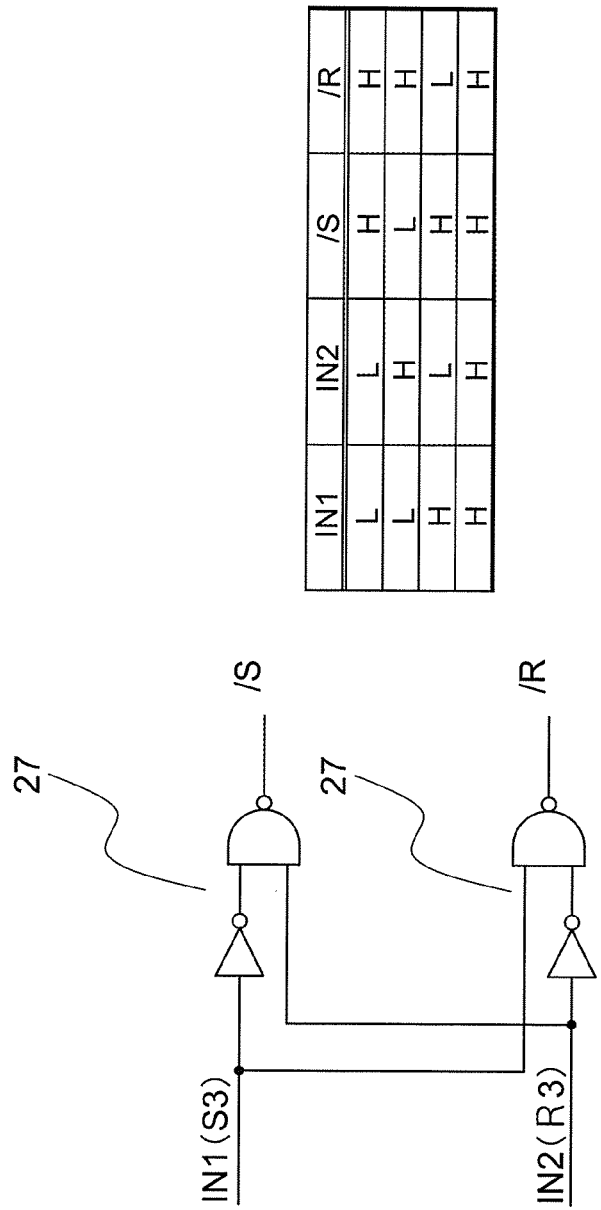
FIG. 20 is an explanatory diagram illustrating the configuration of a circuit for preventing malfunction by common-mode noise in a signal transmission device according to Embodiment 2 of the present invention.

In Embodiment 1 described above, the output from the single-ended Schmitt trigger circuits 14 is inputted directly to the RS flip flop 15, as illustrated in FIG. 1, However, instances may occur where the single-ended Schmitt trigger circuits 14 malfunction and L is output-ted by two circuits, in a case: where dV/dt noise is applied having a magnitude that exceeds a value determined in advance as an allowable limit. In order to prevent, such a malfunction, a circuit 27 for preventing malfunction by common-mode noise may be inserted between the single-ended Schmitt trigger circuits 14 and the RS flip flop 15, as illustrated, in FIG. 20. Since dV/dt noise is applied to both the transformer 22 for set signals and the transformer 22 for reset signals, both inputs at the input terminals IN1 and IN2 (S3 and R3) of the circuit 27 for preventing malfunction by common-mode noise are L, but the two outputs corresponding to the inputs are kept at H, and accordingly the value set in the RS flip flop 15 does not change.

Embodiment 3

In above-described Embodiment 1, the single-ended Schmitt trigger circuits 14 are made up of three NMOSs (M1, M2, M3) and three PMOSs (M4, M5, M6) as illustrated in FIG. 12A and FIG. 12B. However, the embodiment is not limited thereto, and there may be used, single-ended Schmitt trigger circuits 14 made up of three NMOSs (M1, M2, M3) and one PMOS (M5), as illustrated in FIG. 21A, or single-ended Schmitt trigger circuits 14 made up of one NMOS (M1) and three PMOSs (M4, M5, M6), as illustrated in FIG. 21B.

Embodiment 4

In Embodiment 1 described above, the transmission pulse generation circuit 9 generates a single pulse at the terminal S1, at the rising edge of the input signal IN, and generates a single pulse at the terminal R1, at the falling edge of the input signal IN. However, the present embodiment is not limited thereto, and an arbitrary number of multiple pulses equal to or greater than 2 may be generated, as illustrated in FIG. 22, in order to increase the precision of signal transmission. Thus, even if malfunction occurs in a first pulse, the signal is corrected by any one of the second and subsequent pulses that succeed the first pulse.

Embodiment 5

In Embodiment 1 described above, the transformers 22a, 22b and the reception circuit 24 are formed on the same chip, and accordingly ESD protective elements connected to the transformer connection terminals of the reception circuit 24 can be omitted. Therefore, as described above, negative pulses generated in the reception-side inductors 11 can be used in signal transmission. In Embodiment 5, the negative pulses generated in the reception-side inductors can be used in signal transmission by using multi-stage connection of ESD protective elements of the reception circuit 24, in a case where the transformer 22 and the reception circuit 24 are configured in separate chips as illustrated in FIG. 16A.

Figure 25:
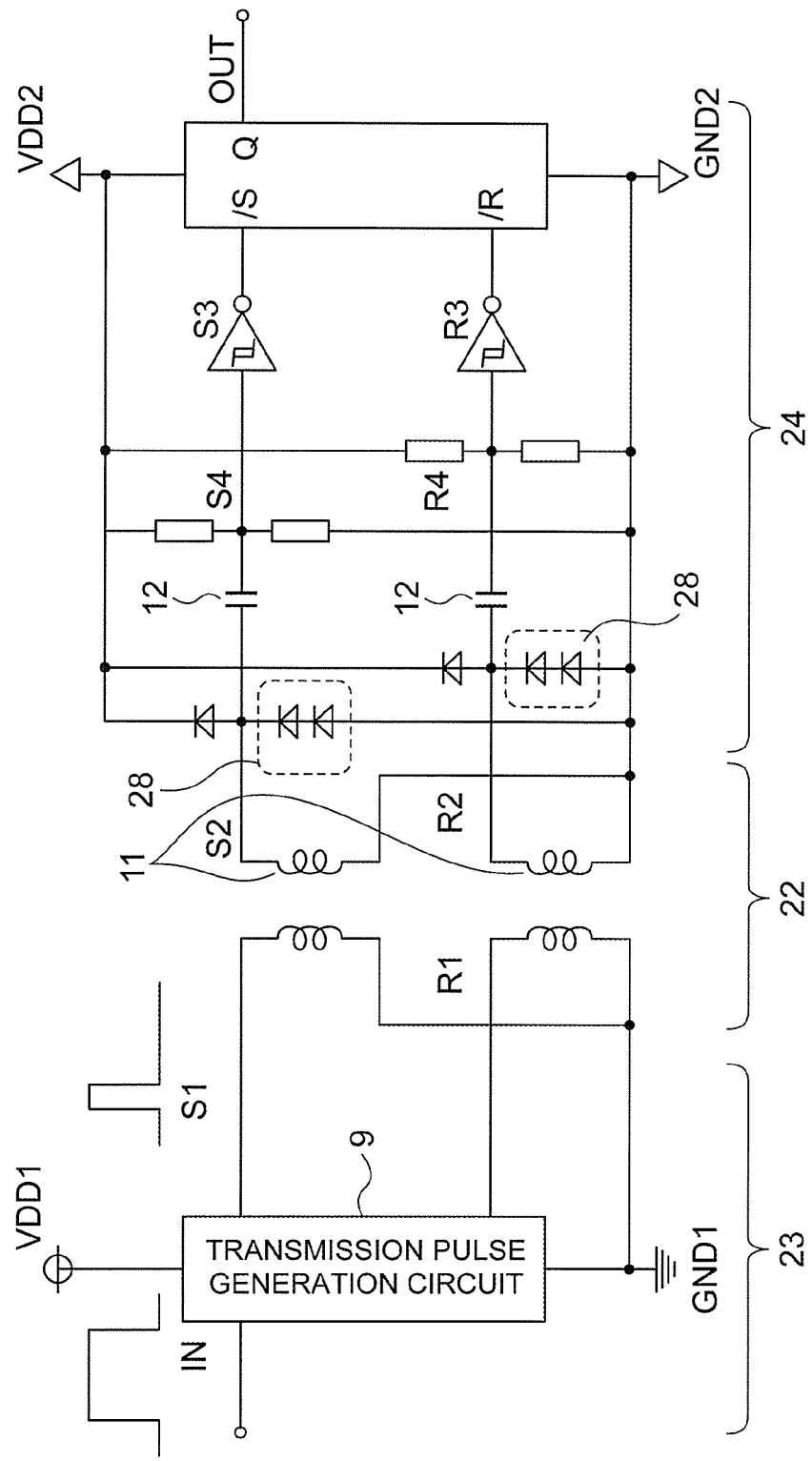
FIG. 25 is a circuit diagram illustrating the configuration of the signal transmission device according to Embodiment 5 of the present invention.

FIG. 25 illustrates a signal transmission circuit of Embodiment 5. In the configuration of FIG. 25, the transformer 22 and the reception circuit 24 are configured in separate chips, as illustrated in FIG. 16A, and ESD protective elements 28 connected to GND2 provided in the reception circuit 24 are connected in multiple stages.

Specifically, in Embodiment 5, an ESD protective element 28 is provided between GND2 of the reception circuit 24 and the connection point of the terminal 32 of the reception-side inductors 11 and a coupling capacitor 12, as illustrated in FIG. 25. Similarly, a further ESD protective element 28 is provided between GND2 of the reception-circuit 24 and the connection point of the terminal R2 of the reception-side inductors 11 and a coupling capacitor 12. Thus, the ESD protective elements 2b are connected series between GND2 and respective input terminals S2, R2 of the reception circuit 24 that receive a transmission signal from the transmission circuit 23. The ESD protective elements 28 are provided in parallel so as to make up multiple stages. In the example of FIG. 25, the ESD protective elements 28 are provided in two stages. The number of stages is not limited to 2, and there may be an arbitrary number of stages.

In Embodiment 5, the transformer 22 and the reception circuit 24 are configured as separate chips, and ESD protective elements 28 connected to GND2 provided in the reception circuit 24 are connected in multiple stages; as a result, it becomes possible to suppress chip breakage due to electrostatic discharge, and to use in signal transmission negative pulses generated at the terminals S2 and R2 of the reception-side inductors 11. The multi-stage connected ESD protective elements 28 must be set to operate at electrostatic discharge, and not to operate at a negative pulse voltage generated in signal transmission. In a case where, for instance, both positive and negative pulse voltages generated in signal transmission are ±1 V making GND2 as a reference and a forward drop voltage (VF) of the ESD protective elements 28 is 0.6 V, the ESD protective elements 28 do not operate at the negative pulse voltage −1 V generated in signal transmission, but the ESD protective elements operate instead at or below −1.2 V, which is twice the forward drop voltage (VF), since the ESD protective elements 28 connected to GND2 are serially stacked in two tiers. By setting thus the forward drop voltage (VF) of the ESD protective elements 28 to be larger than the amplitude of the reception signal being no greater than the ground potential of the reception circuit 24 side, the multi-stage connected ESD protective elements 28 operate as a result at electrostatic discharge, and not at the reception signal of the reception circuit 24 generated in signal transmission.

In Embodiment 5, thus, the transformer 22 and the reception circuit 24 are configured as separate chips, and the ESD protective elements connected to GND2 provided in the reception circuit 24 are connected in multiple stages; as a result, it becomes possible to suppress chip breakage due to electrostatic discharge, and to use for signal transmission negative pulses generated at the terminals S2 and R2 of the reception-side inductors 11.

The invention claimed is:
1. A signal transmission device, comprising:
a transmission circuit that operates with power from a first power supply and generates a transmission signal based on an input signal;

a transformer that is connected to the transmission circuit; and a reception circuit that operates with power from a second power supply and receives via the transformer the transmission signal outputted by the transmission circuit, wherein the transformer comprises two transformers, which are a first transformer and a second transformer, each of the transformers being made up of a transmission-side inductor and a reception-side inductor;

the transmission circuit inputs a transmission-side voltage signal, made up of one or a plurality of pulses, to a transmission terminal of the transmission-side inductor of the first transformer, in synchronization with a rising edge of the input signal, and inputs a transmission-side voltage signal, made up of one or a plurality of pulses, to a transmission terminal of the transmission-side inductor of the second transformer, in synchronization with a falling edge of the input signal;

one terminal of two terminals of each of the reception-side inductors of the first and second transformers is connected to the second power supply or ground of the reception circuit, while the other of the two terminals is connected via capacitors to an input terminal of a signal detection circuit provided in the reception circuit; and the signal detection circuit is configured of a single-ended Schmitt trigger circuit, an upper threshold voltage and a lower threshold voltage of the single-ended Schmitt trigger circuit are set such that:

voltage at the other terminal of each of the reception-side inductors of the first and second transformers, in the absence of a signal, lies between the upper and lower threshold voltages;

voltage at the other terminal of each of the reception-side inductors of the first and second transformers is higher than the upper threshold voltage of the single-ended Schmitt trigger circuit, at a rising edge of the transmission-side voltage signal that is inputted to the transmission terminals of the transmission-side inductors of the first and the second transformers, and;

voltage at the other terminal of each of the reception-side inductors of the first and second transformers is lower than the lower threshold voltage of the single-ended Schmitt trigger circuit, at a falling edge of the transmission-side voltage signal that is inputted to the transmission terminals of the transmission-side inductors of the first and the second transformers.

2. The signal transmission device of claim 1, wherein
the upper threshold voltage of the single-ended Schmitt trigger circuit is set to a value higher than that of voltage that is generated when current of a value resulting from multiplying a transformer parasitic capacitance of the first and second transformers and an allowable rate of change of input common-mode voltage is caused to flow through parasitic capacitances of the reception-side inductors and through bias resistors of respective DC bias setting circuits provided in the reception-side inductors.

3. The signal transmission device of claim 1, wherein
the first and second transformers and the reception circuit are formed on the same chip.

4. A signal transmission device, comprising:
a transmission circuit that operates with power from a first power supply and generates a transmission signal based on an input signal;

a transformer that is connected to the transmission circuit; and a reception circuit that operates with power from a second power supply and receives via the transformer the transmission signal outputted by the transmission circuit, wherein the transformer comprises two transformers, which are a first transformer and a second transformer, each of the transformers being made up of a transmission-side inductor and a reception-side inductor;

the transmission circuit inputs a transmission-side voltage signal, made up of one or a plurality of pulses, to a transmission terminal of the transmission-side inductor of the first transformer, in synchronization with a rising edge of the input signal, and inputs a transmission-side voltage signal, made up of one or a plurality of pulses, to a transmission terminal of the transmission-side inductor of the second transformer, in synchronization with a falling edge of the input signal;

one terminal of two terminals of each of the reception-side inductors of the first and second transformers is connected to the second power supply or ground of the reception circuit, while the other of the two terminals is connected via capacitors to an input terminal of a signal detection circuit provided in the reception circuit; and the signal detection circuit is configured of a single-ended Schmitt trigger circuit, the first and second transformers and the reception circuit are formed at separate chips, the signal transmission device further comprising ESD protective elements, connected in series in multiple stages, between ground and an input terminal of the reception circuit that receives the transmission signal from the transmission circuit.

5. The signal transmission device of claim 4, wherein
a forward drop voltage of the ESD protective elements connected in multistage fashion is set to be larger than an amplitude of a reception signal that is equal to or smaller than ground potential on the side of the reception circuit; and the ESD protective elements connected in multistage fashion operate at electrostatic discharge and does not operate on the basis of the reception signal of the reception circuit, generated in signal transmission.

* * * * *